(12) United States Patent
Jang et al.

(10) Patent No.: US 11,374,129 B2
(45) Date of Patent: Jun. 28, 2022

(54) OXIDE SEMICONDUCTOR THIN FILM TRANSISTOR AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Su Hui Lee, Seoul (KR)

(73) Assignee: UNIVERSITY-INDUSTRY COOPERATION GROUP OF KYUNG HEE UNIVERSITY, Yongin-si (KR)

(*) Notice: Subject to any disclaimer, the term of this patent is extended or adjusted under 35 U.S.C. 154(b) by 0 days.

(21) Appl. No.: 16/546,904

(22) Filed: Aug. 21, 2019

(65) Prior Publication Data

US 2020/0066913 A1 Feb. 27, 2020

(30) Foreign Application Priority Data

Aug. 22, 2018 (KR) .................. 10-2018-0098100

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1218* (2013.01); *H01L 27/1262* (2013.01);
(Continued)

(58) Field of Classification Search
CPC ............. H01L 29/7869; H01L 29/0669; H01L 29/413; H01L 29/41733
See application file for complete search history.

(56) References Cited

U.S. PATENT DOCUMENTS

2009/0056854 A1* 3/2009 Oh ..................... C09D 5/24
156/60
2013/0043475 A1* 2/2013 Kim .................. H01L 29/78678
257/59
(Continued)

FOREIGN PATENT DOCUMENTS

JP 2013-214537 A 10/2013
KR 10-0670407 B1 1/2007
(Continued)

OTHER PUBLICATIONS

Dongxiang Lou et al, Influence of Source and Drain Contacts on the Properties of Indium-Gallium-Zinc-Oxide Thin-Film Transistors based on Amorphous Carbon Nanofilm as Barrier Layer, 7 Applied Materials & Interfaces 3633, 3633-3640 (2015) (Year: 2015).*
(Continued)

*Primary Examiner* — Feifei Yeung Lopez
(74) *Attorney, Agent, or Firm* — Sughrue Mion, PLLC

(57) ABSTRACT

Disclosed are an oxide semiconductor thin film transistor and a method of fabricating the same. An oxide semiconductor thin film transistor according to an embodiment of the present disclosure includes a substrate; a first gate electrode formed on the substrate; a gate insulator formed on the first gate electrode; an oxide semiconductor layer formed on the gate insulator; source and drain electrodes formed by depositing carbon nanotubes (CNTs) and a metal electrode on the formed the oxide semiconductor layer and patterning the deposited CNTs and metal electrode such that the source electrode and the drain electrode are spaced apart from each other; and a passivation layer formed on the formed source and drain electrodes, wherein the source and drain electrodes serve to prevent diffusion of a metal of the metal electrode into the formed oxide semiconductor layer, due to the CNTs of the source and drain electrodes.

6 Claims, 56 Drawing Sheets

(51) Int. Cl.
  *H01L 29/417* (2006.01)
  *H01L 29/06* (2006.01)
  *H01L 29/41* (2006.01)
(52) U.S. Cl.
  CPC ........ *H01L 29/0669* (2013.01); *H01L 29/413* (2013.01); *H01L 29/41733* (2013.01)

(56) References Cited

U.S. PATENT DOCUMENTS

| | | | | |
|---|---|---|---|---|
| 2013/0157399 | A1* | 6/2013 | Park | H01L 27/1225 438/34 |
| 2013/0264563 | A1* | 10/2013 | Okazaki | H01L 21/385 257/43 |
| 2013/0280859 | A1* | 10/2013 | Kim | H01L 29/78696 438/104 |
| 2014/0059850 | A1* | 3/2014 | Zhou | H05K 3/30 29/832 |
| 2015/0171115 | A1* | 6/2015 | Yamazaki | H01L 27/115 257/43 |
| 2021/0013235 | A1* | 1/2021 | Toda | H01L 27/3248 |

FOREIGN PATENT DOCUMENTS

| | | |
|---|---|---|
| KR | 10-2012-0071373 A | 7/2012 |
| KR | 10-2012-0078639 A | 7/2012 |
| KR | 10-2012-0124126 A | 11/2012 |
| KR | 10-2013-0006999 A | 1/2013 |
| KR | 10-2014-0019521 A | 2/2014 |
| KR | 10-2015-0028060 A | 3/2015 |
| KR | 10-2015-0063177 A | 6/2015 |
| KR | 10-1577896 B1 | 12/2015 |
| KR | 10-2017-0041433 A | 4/2017 |
| KR | 10-1795212 B1 | 12/2017 |

OTHER PUBLICATIONS

Communication dated Dec. 19, 2019, issued by the Korean Patent Office in counterpart Korean Patent Application No. 10-2018-0098100.

Kai Zhu et al., "A Carbon Nanotube Electrode a-IGZO-TFT," Journal of the Electron Devices Society, Sep. 2017, pp. 411-415, vol. 5, No. 5.

Dongxiang Luo et al., "Influence of Source and Drain Contacts on the Properties of Indium-Gallium-Zinc-Oxide Thin-Film Transistors base on Amorphous Carbon Nanofilm as Barrier Layer," ACS Appl. Mater. Interfaces, Jul. 2015, 11 pages.

Communication dated Jun. 29, 2020, Issued by the Korean Patent Office in counterpart Korean Application No. 10-2018-0098100.

Communication dated Jul. 21, 2021, issued by the Korean Patent Office in counterpart Korean Application No. 10-2021-0049360.

* cited by examiner

OXIDE SEMICONDUCTOR THIN FILM TRANSISTOR AND METHOD OF FABRICATING THE SAME

CROSS-REFERENCE TO RELATED APPLICATION

This application claims priority to and the benefit of Korean Patent Application No. 10-2018-0098100, filed on Aug. 22, 2018, the disclosure of which is incorporated herein by reference in its entirety.

BACKGROUND

1. Field of the Invention

The present disclosure relates to an oxide semiconductor thin film transistor and a method of fabricating the same, and more particularly, to an oxide semiconductor thin film transistor for a flexible display apparatus capable of improving the lifespan and reliability of the flexible display apparatus and a method of fabricating the oxide semiconductor thin film transistor.

2. Discussion of Related Art

In recent years, display apparatuses driven by a thin film transistor (TFT) fabricated using indium gallium zinc oxide (a-IGZO) as an oxide semiconductor have been rapidly developed.

In addition, considerable research has been conducted on an inverter fundamentally necessary for driving of a display apparatus, and a ring oscillator and driving circuit using the inverter.

Further, research into a driving element used in flexible displays has been considerably conducted.

In general, a flexible display apparatus is manufactured by forming a display on a flexible substrate, thereby exhibiting flexibility. Such a flexible display apparatus is very advantageous in that the shape of thereof may be flexed or bent as needed.

Such as a flexible display apparatus may be applied in various fields such as mobile communication devices, wearable smart devices, foldable devices, automobile displays, digital signage, electronic newspaper, electronic books, electronic boards, bulletin boards, and billboards, thereby being expected to achieve next generation display development.

Meanwhile, a flexible display apparatus is required to maintain display performance thereof when bent, but the display performance thereof is deteriorated when excessively bent. In particular, in the case of a flexible display apparatus, a thin film transistor is formed on a flexible substrate. When such a flexible display apparatus is greatly bent, stress due to bending is transmitted to a thin film transistor, and thus, cracks are generated, whereby the properties of the thin film transistor are deteriorated.

Accordingly, when such a flexible display is repeatedly bent or flexed or is increased in size, generation of cracks may greatly increase, whereby the lifespan and reliability of the flexible display may be decreased.

Therefore, upon formation of an oxide semiconductor thin film transistor, a metal electrode made of molybdenum or the like is generally used as a source electrode and a drain electrode.

However, when source and drain electrodes are formed using a metal electrode, they have a drawback of being vulnerable to high current stress and temperature.

Recently, carbon nanotubes (CNTs) having excellent electrical selectivity and good field emission characteristics have attracted attention as a material of electronic products.

Meanwhile, article "A Carbon Nanotube Electrode a-IGZO-TFT" published on Jun. 14, 2017 in the Journal of the Electron Devices Society proposed an amorphous indium gallium zinc oxide (a-IGZO) thin film transistor in which carbon nanotubes were used as a source/drain/gate electrode.

In addition, "Influence of Source and Drain Contacts on the Properties of Indium-Gallium-Zinc-Oxide Thin-Film Transistors based on AmorphousCarbon Nanofilm as Barrier Layer" published on July, 2015 in a research journal, APPLIED MATERIALS & INTERFACES, introduced a TFT display wherein a Ti/C S/D electrode was used as source and drain electrodes in an amorphous indium-gallium-zinc-oxide thin film ($\alpha$-IGZO TFT).

The transistors introduced in the journals cannot prevent the diffusion of a metal material which may occur after being subjected to high current stress, and the transfer characteristics thereof may be low compared to the case of using a metal electrode.

Therefore, there is a need for development of an oxide semiconductor thin film transistor exhibiting high transfer characteristics while being capable of preventing diffusion of an oxide even under high current stress.

RELATED ART DOCUMENTS

Patent Documents

Korean Patent No. 10-1795212, entitled "DUAL GATE THIN FILM TRANSISTOR INCLUDING MULTILAYERED SEMICONDUCTOR LAYER"

Korean Patent Application Publication No. 10-2014-0019521, entitled "LIGHT EMITTING ELEMENT"

Korean Patent Application Publication No. 10-2015-0028060, entitled "OXIDE SEMICONDUCTOR THIN FILM TRANSISTOR AND METHOD OF FABRICATING THE SAME"

Korean Patent No. 10-1577896, entitled "INTERMEDIATE CARBON NANOTUBE LAYER, METHOD OF FABRICATING THE SAME, AND THIN FILM TRANSISTOR FABRICATED USING THE SAME"

Non-Patent Documents

KAI ZHU and 2 others, "A Carbon Nanotube Electrode a-IGZO-TFT", JOURNAL OF THE ELECTRON DEVICES SOCIETY (2017.09)

Dongxiang Luo and 8 others, "Influence of Source and Drain Contacts on the Properties of Indium-Gallium-Zinc-Oxide Thin-Film Transistors based on Amorphous Carbon Nanofilm as Barrier Layer" (2015.07)

SUMMARY OF THE INVENTION

Therefore, the present disclosure has been made in view of the above problems, and it is an objective of the present disclosure to provide an oxide semiconductor thin film transistor fabricated using carbon nanotubes (CNTs) with a high thermal conductivity, a high work function, and a small Young's modulus, and a laminated structure of the carbon nanotubes and a metal electrode as source and drain electrodes, thereby exhibiting stable characteristics in a semiconductor device having a short channel.

It is another objective of the present disclosure to provide an oxide semiconductor thin film transistor having a structure that is capable of minimizing thermal damage due to high current in a short channel.

It is still another objective of the present disclosure to provide a source electrode and drain electrode formed using carbon nanotubes as a material with a high thermal conductivity to prevent diffusion of a metal into an oxide semiconductor layer after being subjected to high current stress.

It is still another objective of the present disclosure to provide source and drain electrodes fabricated using a laminated structure of carbon nanotubes and a metal electrode, thereby preventing property deterioration due to bending and high heat and stable characteristics upon formation of a short channel.

It is yet another objective of the present disclosure to provide source and drain electrodes formed using carbon nanotubes, thereby providing high flexibility.

In accordance with an aspect of the present disclosure, the above and other objects can be accomplished by the provision of an oxide semiconductor thin film transistor, including a substrate; a first gate electrode formed on the substrate; a gate insulator formed on the first gate electrode; an oxide semiconductor layer formed on the gate insulator; source and drain electrodes formed by depositing carbon nanotubes (CNTs) and a metal electrode on the formed the oxide semiconductor layer and patterning the deposited CNTs and metal electrode such that the source electrode and the drain electrode are spaced apart from each other; and a passivation layer formed on the formed source and drain electrodes, wherein the source and drain electrodes serve to prevent diffusion of a metal of the metal electrode into the formed oxide semiconductor layer, due to the CNTs of the source and drain electrodes.

In accordance with an embodiment of the present disclosure, the source and drain electrodes may be formed by laminating the metal electrode on the CNTs.

In accordance with an embodiment of the present disclosure, the source and drain electrodes may serve to control contact resistance, due to the CNTs therein, when molybdenum (Mo) forming the metal electrode contacts the oxide semiconductor layer.

In accordance with an embodiment of the present disclosure, the CNTs of the source and drain electrodes may serve to prevent molybdenum (Mo) forming the metal electrode from being diffused into an oxide semiconductor layer at a temperature of 400° C. or higher.

In accordance with an embodiment of the present disclosure, the CNTs of the source and drain electrodes may be formed to a thickness of 2 nm to 150 nm.

In accordance with an embodiment of the present disclosure, a second gate electrode may be further formed on the formed passivation layer.

In accordance with an embodiment of the present disclosure, the second gate electrode may be formed to be spaced apart from the source and drain electrodes by −1 μm to 3 μm in a horizontal direction.

In accordance with an embodiment of the present disclosure, the oxide semiconductor thin film transistor may further include a connection electrode configured to electrically connect the first gate electrode and the second gate electrode.

In accordance with an embodiment of the present disclosure, the first gate electrode and the second gate electrode may be electrically connected to each other to apply the same voltage thereto.

In accordance with an embodiment of the present disclosure, the first gate electrode may be formed to be spaced apart from the source and drain electrodes formed on the oxide semiconductor layer by −1 μm to 3 μm in a horizontal direction.

In accordance with another aspect of the present disclosure, there is provided a method of fabricating an oxide semiconductor thin film transistor, the method including forming a first gate electrode on a substrate; forming a gate insulator on the first gate electrode; forming an oxide semiconductor layer on the gate insulator; depositing CNTs and a metal electrode on the formed oxide semiconductor layer; forming source and drain electrodes by patterning the deposited CNTs and metal electrode such that the source and drain electrodes are spaced apart from each other; and forming a passivation layer on the formed source and drain electrodes, wherein the source and drain electrodes serve to prevent diffusion of a metal of the metal electrode into the formed oxide semiconductor layer, due to the CNTs of the source and drain electrodes.

In accordance with an embodiment of the present disclosure, a second gate electrode may be further included under the oxide semiconductor layer.

In accordance with another aspect of the present disclosure, there is provided a display apparatus including a substrate; the above oxide semiconductor thin film transistor formed on the substrate; and a display device electrically connected to the oxide semiconductor thin film transistor.

In accordance with an embodiment of the present disclosure, the display device may be an organic light emitting device.

In accordance with yet another aspect of the present disclosure, there is provided a method of fabricating an oxide semiconductor thin film transistor, the method including forming a first gate electrode on a substrate; forming a gate insulator on the first gate electrode; forming an oxide semiconductor layer on the gate insulator; depositing CNTs and a metal electrode on the formed oxide semiconductor layer; forming source and drain electrodes by patterning the deposited CNTs and metal electrode such that the source and drain electrodes are spaced apart from each other; and forming a passivation layer on the formed source and drain electrodes, wherein the source and drain electrodes serve to prevent diffusion of a metal of the metal electrode into the formed oxide semiconductor layer, due to the CNTs of the source and drain electrodes.

In accordance with an embodiment of the present disclosure, the method of fabricating an oxide semiconductor thin film transistor may further include forming a second gate electrode on the passivation layer.

In accordance with an embodiment of the present disclosure, the source and drain electrodes may be formed by depositing the metal electrode on the CNTs, the CNTs may serve to control contact resistance occurring when molybdenum (Mo) forming the metal electrode contacts the oxide semiconductor layer, and the CNTs may serve to prevent diffusion of the molybdenum (Mo) into the oxide semiconductor layer at a high temperature of 400° C. or higher.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1A:
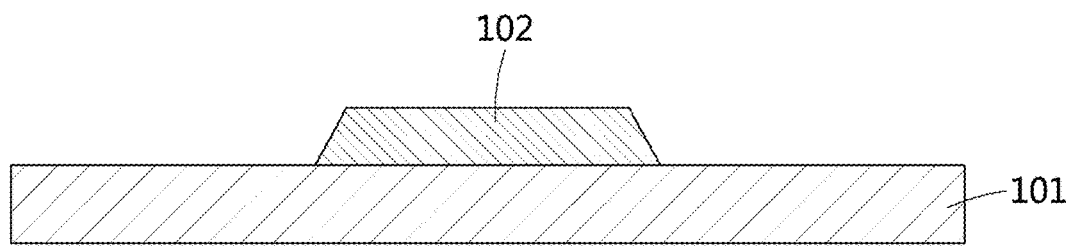
FIGS. 1A to 1F illustrate sectional views for describing a flow of a method of fabricating an oxide semiconductor thin film transistor according to an embodiment of the present disclosure.

The present disclosure will now be described more fully with reference to the accompanying drawings, in which exemplary embodiments of the disclosure are shown.

This disclosure, however, should not be construed as limited to the exemplary embodiments and terms used in the exemplary embodiments, and should be understood as including various modifications, equivalents, and substituents of the exemplary embodiments.

Preferred embodiments of the present disclosure are now described more fully with reference to the accompanying drawings. In the description of embodiments of the present disclosure, certain detailed explanations of related known functions or constructions are omitted when it is deemed that they may unnecessarily obscure the essence of the disclosure.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In the drawings, like reference numerals in the drawings denote like elements.

As used herein, the singular forms "a," "an" and "the" are intended to include the plural forms as well, unless context clearly indicates otherwise.

Expressions such as "A or B" and "at least one of A and/or B" should be understood to include all possible combinations of listed items.

Expressions such as "a first," "the first," "a second" and "the second" may qualify corresponding components irrespective of order or importance and may be only used to distinguish one component from another component without being limited to the corresponding components.

In the case in which a (e.g., first) component is referred as "(functionally or communicatively) connected" or "attached" to another (e.g., second) component, the first component may be directly connected to the second component or may be connected to the second component via another component (e.g., third component).

In the specification, the expression " . . . configured to . . . (or set to)" may be used interchangeably, for example, with expressions, such as " . . . suitable . . . ," " . . . for having ability to . . . ," " . . . modified to . . . ," " . . . manufactured to . . . ," " . . . enabling to . . . ," or " . . . designed to . . . ," in the case of hardware or software depending upon situations.

In any situation, the expression "a device configured to . . . " may refer to a device configured to operate "with another device or component."

For examples, the expression "a processor configured (or set) to execute A, B, and C" may refer to a specific processor performing a corresponding operation (e.g., embedded processor), or a general-purpose processor (e.g., CPU or application processor) executing one or more software programs stored in a memory device to perform corresponding operations.

In addition, the expression "or" means "inclusive or" rather than "exclusive or".

That is, unless otherwise mentioned or clearly inferred from context, the expression "x uses a or b" means any one of natural inclusive permutations.

Also, the terms, such as 'unit' or 'part', etc., should be understood as a unit that processes at least one function or operation and that may be embodied in a hardware manner, a software manner, or a combination of the hardware manner and the software manner.

FIGS. 1A to 1F illustrate sectional views for describing a flow of a method of fabricating an oxide semiconductor thin film transistor according to an embodiment of the present disclosure.

Hereinafter, the method of fabricating an oxide semiconductor thin film transistor according to an embodiment of the present disclosure is described in detail with reference to FIGS. 1A to 1F.

In accordance with an embodiment of the present disclosure, the oxide semiconductor thin film transistor may include a substrate 101, a first gate electrode 102, a gate insulator 103, an oxide semiconductor layer 104, source and drain electrodes 107 and 108, and a passivation layer 109.

For example, each of the source and drain electrodes 107 and 108 may include carbon nanotubes 105.

For example, the carbon nanotubes 105 included in the source and drain electrodes 107 and 108 may control contact resistance occurring when molybdenum (Mo) forming a metal electrode contacts the oxide semiconductor layer 104.

For example, the source and drain electrodes 107 and 108 are in Schottky diode contact, thereby controlling contact resistance. Accordingly, stable transistor characteristics may be secured even in an oxide semiconductor forming a relatively short channel compared to other transistors.

Accordingly, since the present disclosure uses a laminated structure of carbon nanotubes and a metal electrode as source and drain electrodes, stable characteristics of an oxide semiconductor with a short channel may be secured.

Here, the laminated structure of carbon nanotubes and a metal electrode constituting the source and drain electrodes 107 and 108 may address short channel effects, thereby securing stable electrical or operation characteristics of a transistor.

In addition, in the case of the source and drain electrodes 107 and 108, molybdenum (Mo) forming the metal electrode may be prevented from diffusing into the oxide semiconductor layer 104 at a temperature of 400° C. or higher.

In addition, since the source and drain electrodes 107 and 108 of the present disclosure are formed using carbon nanotubes as a material with a high thermal conductivity, diffusion of a metal into an oxide semiconductor layer after being subjected to high current stress may be prevented.

In addition, holes may be formed in the passivation layer 109, thereby respectively growing a source electrode 110 and a drain electrode 111 from the source electrode and the drain electrode 107 and 08.

Referring to FIG. 1A, by the method of fabricating an oxide semiconductor thin film transistor according to an embodiment of the present disclosure, the first gate electrode 102 may be formed on the substrate 101.

The substrate 101, which is a substrate for supporting various components of the oxide semiconductor thin film transistor, may be a flexible substrate having flexibility.

A flexible substrate may be bent or folded in a specific direction. For example, the flexible substrate may be folded in a transverse direction, a longitudinal direction, or a diagonal direction.

The substrate 101 may be formed of at least one material selected from the group consisting of glass, a polyimide-based polymer, a polyester-based polymer, a silicon-based polymer, an acrylic polymer, a polyolefin-based polymer, or a copolymer thereof.

When a flexible substrate is used as the substrate 101, the flexible substrate may be formed of at least one material selected from the group consisting of, for example, polyester, polyvinyl, polycarbonate, polyethylene, polyacetate, polyimide, polyethersulfone (PES), polyacrylate (PAR), polyethylene naphthalate (PEN), and polyethylene terephthalate (PET).

When a display apparatus provided with the oxide semiconductor thin film transistor according to an embodiment is a transparent flexible display apparatus, the substrate 101 may be formed of a transparent and flexible material.

The substrate 101 may include at least one thin film transistor region. A thin film transistor (TFT) may be disposed in a thin film transistor region, and the thin film transistor region may be arranged in a matrix form in the substrate 101.

The thickness of the substrate 101 may be determined in a range of 1 μm to 30 μm, preferably in a range of 1 μm to 10 μm.

The first gate electrode 102 may be a bottom gate electrode.

The first gate electrode 102 may be formed by depositing a gate conductive film (not shown) and forming a photoresist pattern on the gate conductive film, followed by selectively etching, i.e., patterning, the gate conductive film using the photoresist pattern as a mask.

According to an embodiment, the first gate electrode 102 may be formed to be spaced (offset and overlap) apart by −1 μm to 3 μm in a horizontal direction from the source and drain electrodes 107 and 108 formed on the oxide semiconductor layer 104.

A technique of disposing the first gate electrode 102 to be spaced apart from the source and drain electrodes 107 and 108 formed on the oxide semiconductor layer 104 will be described in more detail in description sections of FIGS. 17A and 17B.

Referring to FIG. 1A again, the first gate electrode 102 may be formed of a metal material, for example, any one of molybdenum (Mo), aluminum (Al), chromium (Cr), gold (Au), titanium (Ti), nickel (Ni), neodymium (Nd), and copper (Cu) or a combination thereof, but may be formed of various materials without being limited to the materials. In addition, the first gate electrode 102 may be formed in a single layer structure or multilayer structure including the material.

The first gate electrode 102 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Figure 1B:
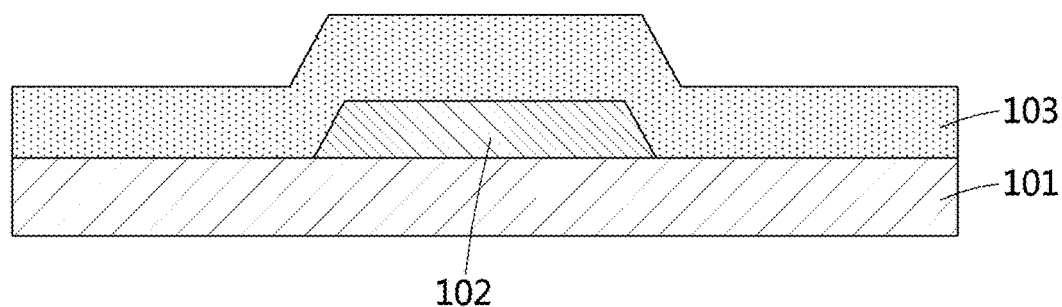

Referring to FIG. 1B, in the method of fabricating an oxide semiconductor thin film transistor according to an embodiment of the present disclosure, the gate insulator 103 is formed on the first gate electrode 102.

The gate insulator 103 according to an embodiment of the present disclosure may be formed on the first gate electrode 102.

In particular, the gate insulator 103 may insulate the first gate electrode 102 and the oxide semiconductor layer 104 from each other. That is, the first gate electrode 102 and the oxide semiconductor layer 104 are insulated from each other by the gate insulator 103.

As shown in FIG. 1B, the gate insulator 103 may be formed to cover an entire surface of the substrate 101 including the first gate electrode 102.

The gate insulator 103 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Preferably, the gate insulator 103 may be formed by spin coating using a solution for forming a gate insulator. Spin coating is performed by adding a certain amount of solution for forming the gate insulator 103 to the substrate 101 dropwise and rotating the substrate 101 at a high speed to coat with the solution for forming the gate insulator 103 by centrifugal force applied thereto. When such spin coating is used, production costs may be reduced compared to a deposition process, and process costs and a process time may be reduced through simplification of a process.

The gate insulator 103 may be, for example, an inorganic material such as silicon oxide (SiOx), silicon nitride (SiNx), titanium oxide (TiOx), or hafnium oxide (HfOx), or an organic material such as polyvinyl alcohol (PVA), polyvinyl pyrrolidone (PVP), or polymethyl methacrylate (PMMA). In addition, the gate insulator 103 may be formed in a single layer structure or multilayer structure including the material, but may be formed of various materials, without being limited to the materials.

Figure 1C:
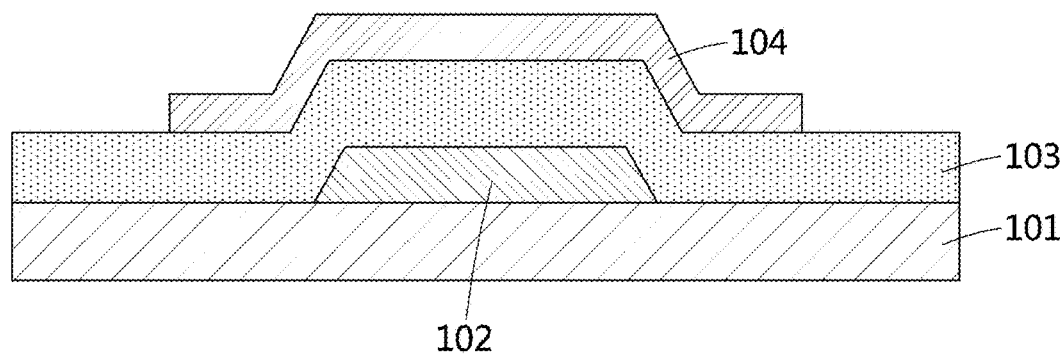

Referring to FIG. 1C, in the method of fabricating an oxide semiconductor thin film transistor according to an embodiment of the present disclosure, the oxide semiconductor layer 104 is formed on the gate insulator 103.

For example, in the method of fabricating an oxide semiconductor thin film transistor, a film for forming the oxide semiconductor layer 104 is formed to cover an entire surface of the gate insulator 103, a photoresist pattern is formed on the oxide semiconductor film, and patterning the oxide semiconductor film in a thin film transistor region to correspond to the first gate electrode 102 using the photoresist pattern as a mask, thereby forming the oxide semiconductor layer 104.

That is, by the method of fabricating an oxide semiconductor thin film transistor, the oxide semiconductor layer 104 may be formed on the gate insulator 103 to correspond to the first gate electrode 102.

The oxide semiconductor layer 104 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating and zone casting, and may be formed of various oxide semiconductor materials.

The oxide semiconductor layer 104 may include, for example, any one selected from the group consisting of indium gallium zinc oxide (IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), and aluminum zinc oxide (AZTO), but may be formed of various materials without being limited to the materials.

The oxide semiconductor layer 104 may be formed of an amorphous or polycrystalline material including the above material.

An oxide semiconductor thin film transistor according to an embodiment of the present disclosure may further include an etch stopper layer (not shown) on the oxide semiconductor layer 104 thereof.

The etch stopper layer may be provided for protection from an etchant on an upper surface of the oxide semiconductor layer 104 so as to secure the stability of the oxide semiconductor layer 104. That is, the etch stopper layer may protect the oxide semiconductor layer 104 against an etchant introduced during an etching process of the source and drain electrodes 107 and 108. The etch stopper layer may be formed of, for example, silicon oxide (SiOx).

Figure 1D:
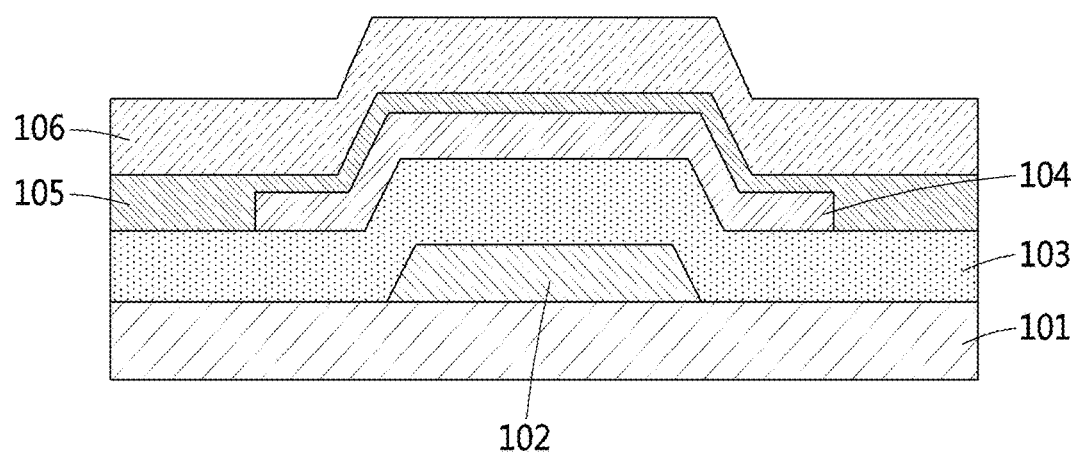

Referring to FIG. 1D, in the method of fabricating an oxide semiconductor thin film transistor according to an embodiment of the present disclosure, carbon nanotubes and a metal electrode are deposited on the oxide semiconductor layer 104.

For example, in the method of fabricating an oxide semiconductor thin film transistor, a metal electrode may be deposited after depositing carbon nanotubes. For example, the metal electrode may include molybdenum.

That is, in the method of fabricating an oxide semiconductor thin film transistor according to an embodiment of the present disclosure, source and drain electrodes 107 and 108 formed of carbon nanotubes and a metal electrode may be formed.

In accordance with an embodiment of the present disclosure, the carbon nanotubes serve to reduce heat generated from any one of the outside and the insider and facilitates dispersion of heat, thereby reducing stress of a device and, accordingly, stabilizing the device.

Accordingly, the oxide semiconductor thin film transistor according to an embodiment of the present disclosure may increase the amount of current passing through the source and drain electrodes 107 and 108 and may exhibit stabilized characteristics in a reliability test of testing a positive voltage, a negative voltage, and a temperature.

Figure 1E:
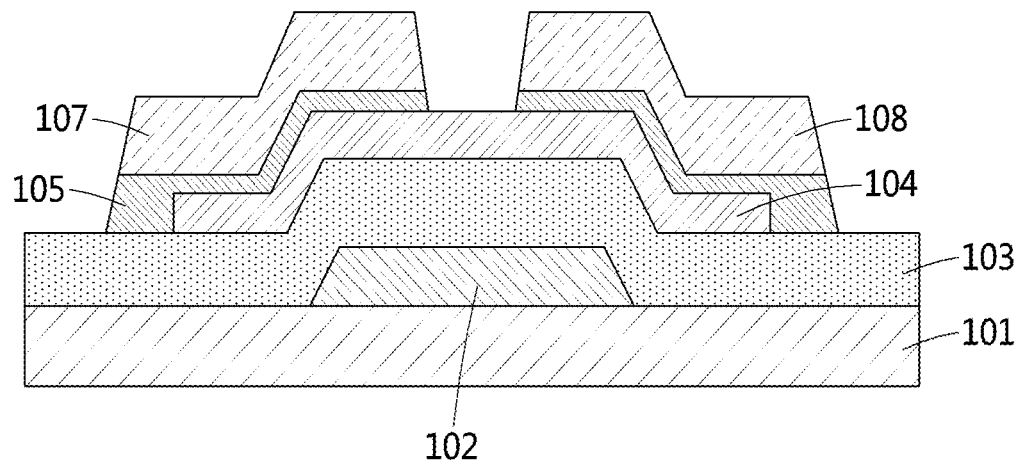

Referring to FIG. 1E, in the method of fabricating an oxide semiconductor thin film transistor, the source electrode 107 and the drain electrode 108 may be formed to be spaced apart from each other on the oxide semiconductor layer 104.

In addition, in the method of fabricating an oxide semiconductor thin film transistor, the carbon nanotubes 105 and a metal electrode together are used together when the source and drain electrodes 107 and 108 are formed on the oxide semiconductor layer 104, so that the carbon nanotubes 105 may be formed between the oxide semiconductor layer 104 and the source electrode 107.

That is, in the method of fabricating an oxide semiconductor thin film transistor according to an embodiment of the present disclosure, carbon nanotubes (CNTs) and a metal electrode may be laminated on the formed oxide semiconductor layer 104, and the laminated CNT and metal electrode may be patterned, so that the source electrode 107 and the drain electrode 108 are formed to be spaced apart from each other.

More particularly, in the method of fabricating an oxide semiconductor thin film transistor, the source and drain electrodes 107 and 108 may be formed to be spaced apart from each other on the gate insulator 103, on which the oxide semiconductor layer 104 has been formed, and to be respectively, electrically connected to the oxide semiconductor layer 104.

Accordingly, the areas of source and drain electrodes of the present disclosure are reduced, so that parasitic capacitance between a gate electrode (first or second gate electrode) and a source or drain electrode is reduced. Accordingly, the present disclosure provides an oxide semiconductor thin film transistor capable of being used as a pixel element of a display apparatus having high electrical characteristics and a method of fabricating the same.

The source and drain electrodes 107 and 108 may be formed by depositing source and drain conductive films (not shown) on the gate insulator 103 including the oxide semiconductor layer 104, and forming a photoresist pattern on the source and drain conductive films, followed by patterning the source and drain conductive films using the photoresist pattern as a mask. Here, the photoresist pattern may be implemented in various shapes.

More particularly, the source and drain electrodes 107 and 108 may be formed by depositing source and drain conductive films by a sputtering method, and then patterning using a photoresist pattern mask with a specific pattern by photolithography.

For example, the source and drain electrodes 107 and 108 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Figure 1F:
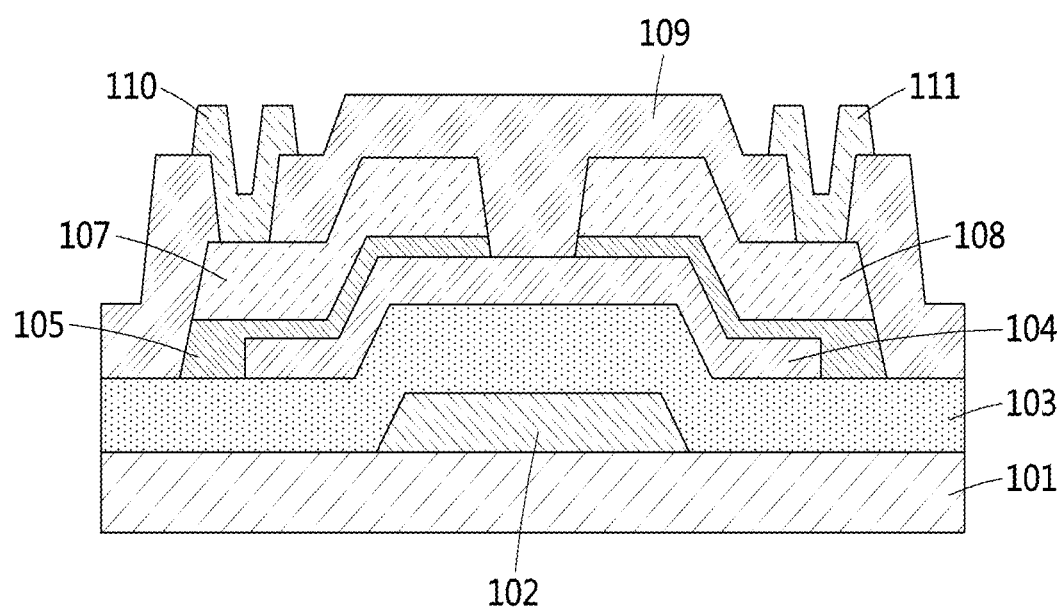

Referring to FIG. 1F, in the method of fabricating an oxide semiconductor thin film transistor according to an embodiment of the present disclosure, the passivation layer 109 may be formed on the source and drain electrodes 107 and 108, and then holes may be formed in the passivation layer 109 to grow the source and drain electrodes 110 and 111.

The oxide semiconductor thin film transistor according to an embodiment of the present disclosure may include the passivation layer 109.

The passivation layer 109 may be formed on the source and drain electrodes 107 and 108. In particular, the passivation layer 109 may be formed to cover all of the gate insulator 103, the oxide semiconductor layer 104, and the source and drain electrodes 107 and 108.

The passivation layer 109, which is a protective layer, may be formed of the same material as that of the gate insulator 103. The passivation layer 109 may be formed of, for example, a single layer constituted of any one of silicon oxide, silicon nitride, and the like or a multilayer structure thereof, but may be formed of various materials without being limited to the materials.

The passivation layer 109 may be formed using at least one method of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

Figure 1G:
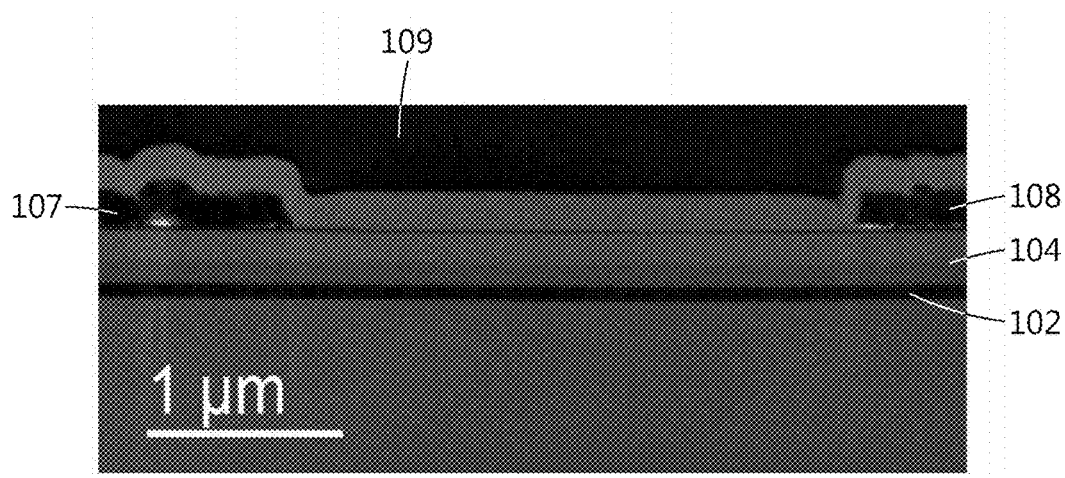
FIG. 1G illustrates an electron microscope image of an oxide semiconductor thin film transistor according to an embodiment of the present disclosure.

FIG. 1G illustrates an electron microscope image of an oxide semiconductor thin film transistor according to an embodiment of the present disclosure.

Examining FIG. 1G, the oxide semiconductor thin film transistor may include a gate electrode 102, a gate insulator 104, a source electrode 107, a drain electrode 108, and a passivation layer 109.

In addition, an active layer may be formed between the source electrode 107 and the drain electrode 108 of the oxide semiconductor thin film transistor.

An electron microscope image shown in FIG. 1G may correspond to the sectional view of the oxide semiconductor thin film transistor shown in FIG. 1F.

Figure 1H:
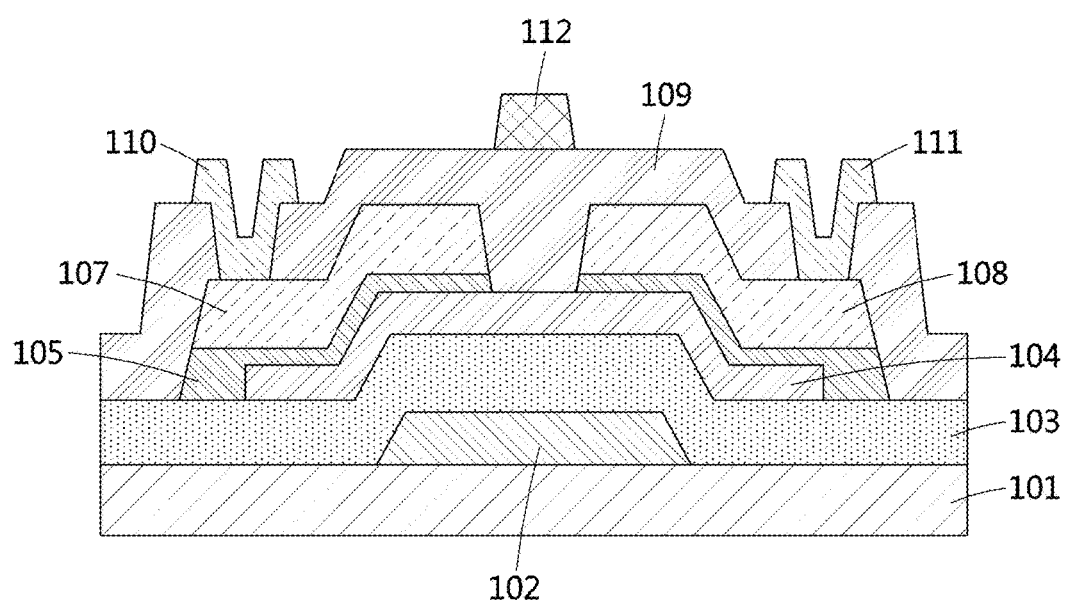
FIG. 1H illustrates a sectional view of an oxide semiconductor thin film transistor according to an embodiment of the present disclosure.

FIG. 1H illustrates a sectional view of an oxide semiconductor thin film transistor according to an embodiment of the present disclosure.

Referring to FIG. 1H, a second gate electrode 112 may be further included on the passivation layer 109 of the oxide semiconductor thin film transistor.

For example, the second gate electrode 112 may also be referred to as a pixel electrode. The second gate electrode 112 is formed on the passivation layer 109. The second gate electrode 112 is electrically connected to each of the source and drain electrodes 107 and 108, and may serve to electrically connect the source and drain electrodes 107 and 108 to other components outside the oxide semiconductor thin film transistor.

For example, the second gate electrode 112 may be formed to be spaced apart from any one of the source and drain electrodes 107 and 108 by −1 μm to 3 μm in a horizontal direction.

The second gate electrode 112 may be formed of a metal material, for example, molybdenum (Mo).

An oxide semiconductor thin film transistor having high electrical characteristics according to an embodiment of the present disclosure may be used as a pixel element of a flexible display such as a liquid crystal display (LCD) or an organic light emitting display (AMOLED).

The oxide semiconductor thin film transistor according to an embodiment of the present disclosure may be used as a pixel element of a flexible display such as a liquid crystal display (LCD) or an organic light emitting display (AMOLED).

For example, the oxide semiconductor thin film transistor is subjected to a step of forming the second gate electrode 112 electrically connected to any one of the source and drain electrodes 107 and 108 to manufacture a display apparatus.

For example, the oxide semiconductor thin film transistor may further include a connection electrode for electrically connecting the first gate electrode 102 and the second gate electrode 112.

For example, as shown in FIGS. 1A and 1H, the passivation layer 109 configured to cover the source and drain electrodes 107 and 108 is formed, the second gate electrode 112 configured to contact with the drain electrode 108 through a through hole of the passivation layer 109 is formed, an intermediate layer (not shown) including a light emitting layer (not shown) is formed on the second gate electrode 112, and a counter electrode (not shown) is formed on the intermediate layer, thereby manufacturing an organic light emitting display apparatus.

With regard to the constituents of the oxide semiconductor thin film transistor according to an embodiment of the present disclosure, glass constituting the substrate 101, silicon dioxide ($SiO_2$) constituting the gate insulator 103, amorphous indium gallium zinc oxide (a-IGZO) constituting the oxide semiconductor layer 104, and carbon nanotubes (CNTs) and metal electrode (molybdenum (Mo)) constituting the source electrode 107 and drain electrode 107 and 108 may exhibit thermal conductivity summarized in Table 1 below.

TABLE 1

| Material | Thermal conductivity (W · m$^{-1}$, k$^{-1}$) |
| --- | --- |
| Glass | 1.09-1.04 |
| Silicon dioxide | 1.1-1.4 |
| a-IGZO | 14.1-1.4 |
| Silicon oxynitride | 2.11-2.35 |
| Carbon nanotube | 3000 |
| Metal electrode (molybdenum (Mo)) | 138 |

In the present disclosure, a laminated structure of carbon nanotubes and a metal electrode is used in source and drain electrodes, whereby stable characteristics may be secured even in an oxide semiconductor with a short channel.

In addition, in the present disclosure, source and drain electrodes are formed using carbon nanotubes as a material with a high thermal conductivity, thereby preventing diffusion of a metal into an oxide semiconductor layer after being subjected to high current stress.

FIGS. 2A to 2D illustrate electron microscope images of carbon nanotubes according to embodiments of the present disclosure.

Figure 2A:
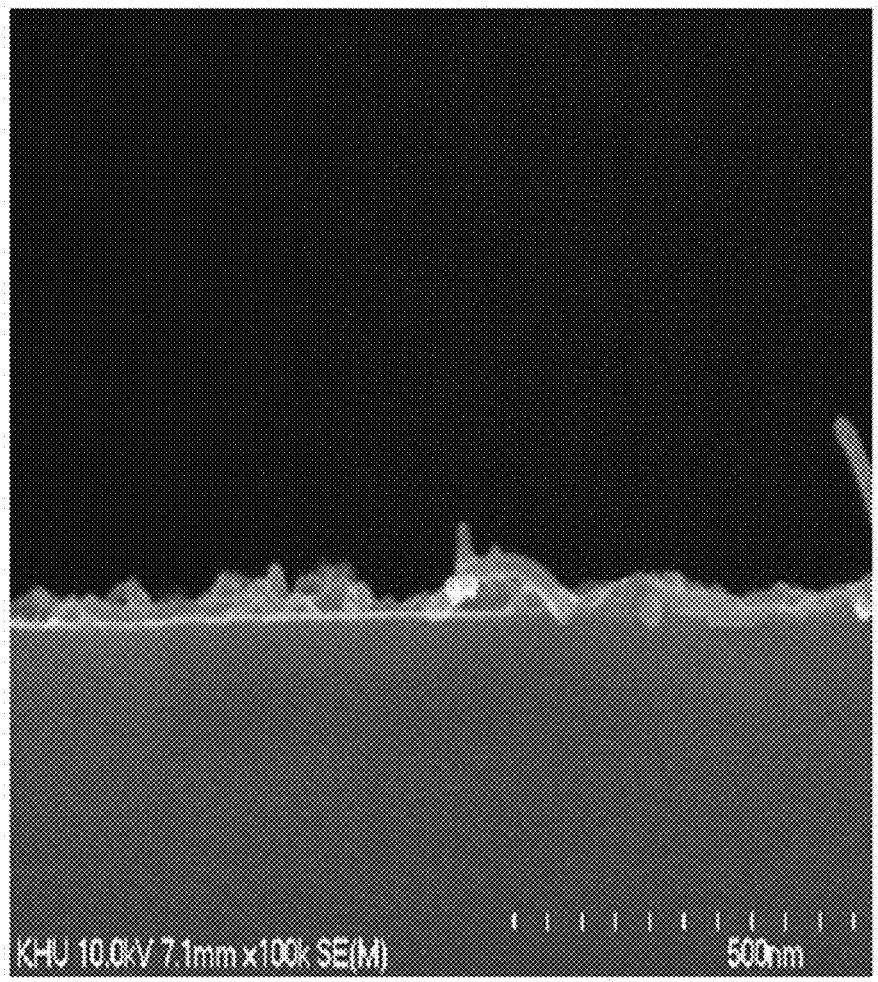
FIGS. 2A to 2D illustrate electron microscope images of carbon nanotubes according to embodiments of the present disclosure.

Referring to FIG. 2A, by the method of fabricating an oxide semiconductor thin film transistor according to an embodiment of the present disclosure, the carbon nanotubes may be formed to a thickness of about 46 nm on the oxide semiconductor layer.

Figure 2B:
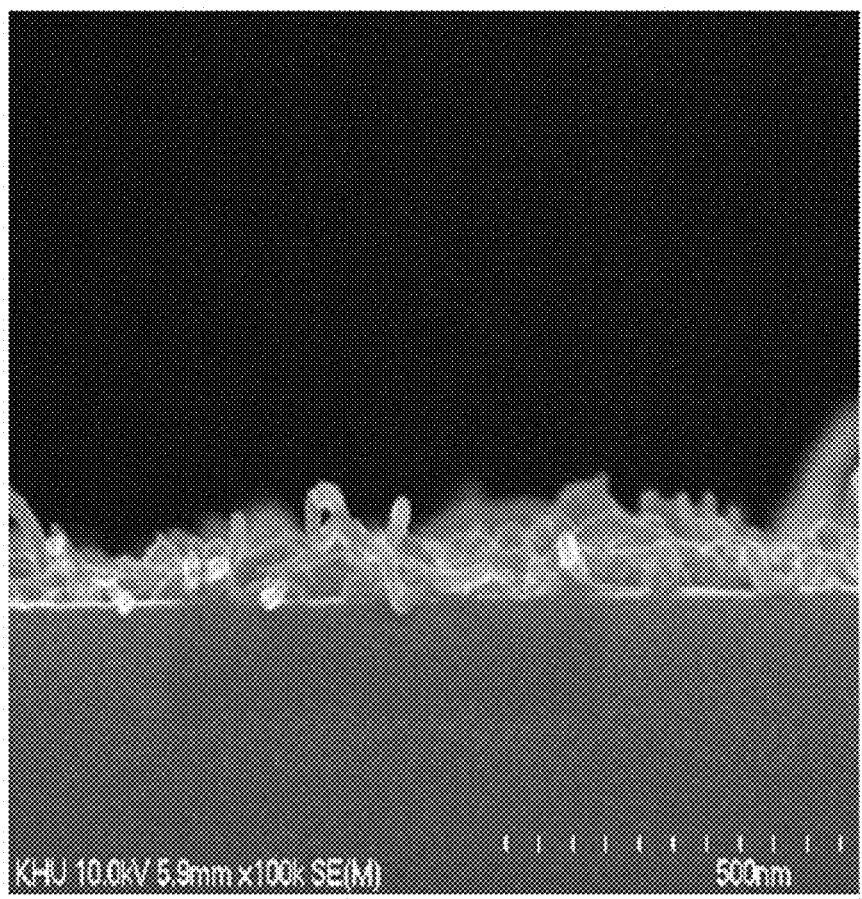

Referring to FIG. 2B, by the method of fabricating an oxide semiconductor thin film transistor according to an embodiment of the present disclosure, the carbon nanotubes may be formed to a thickness of about 67 nm on the oxide semiconductor layer.

Figure 2C:
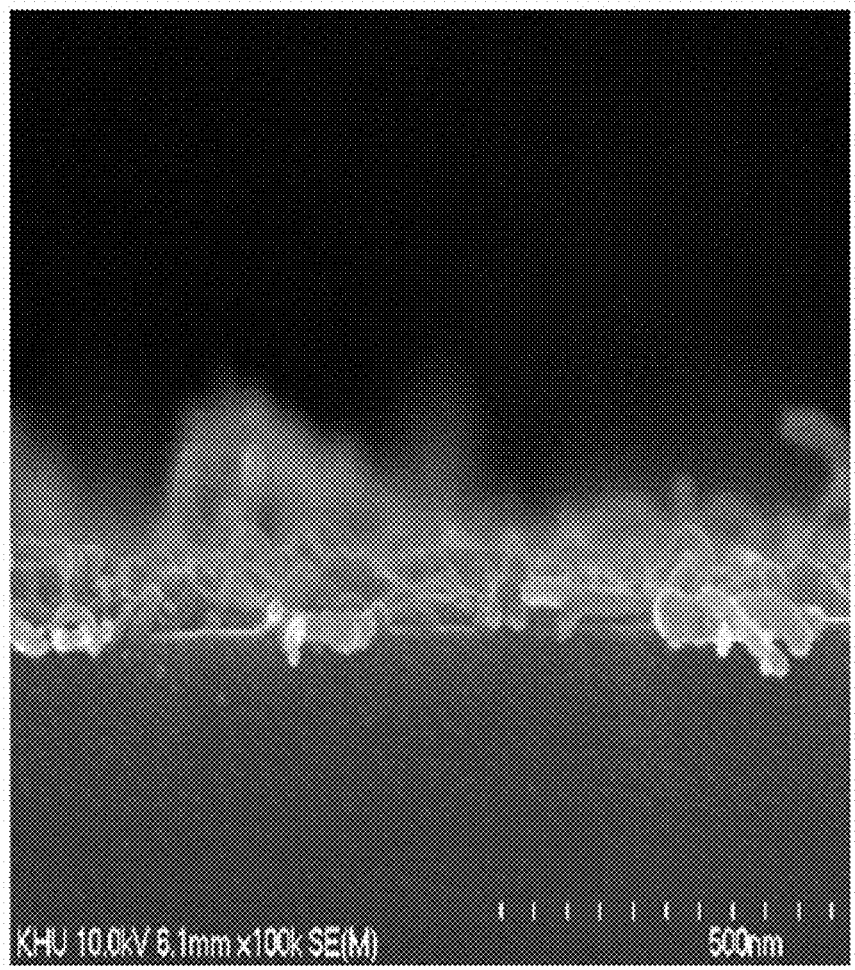

Referring to FIG. 2C, by the method of fabricating an oxide semiconductor thin film transistor according to an embodiment of the present disclosure, the carbon nanotubes may be formed to a thickness of about 96 nm on the oxide semiconductor layer.

Figure 2D:
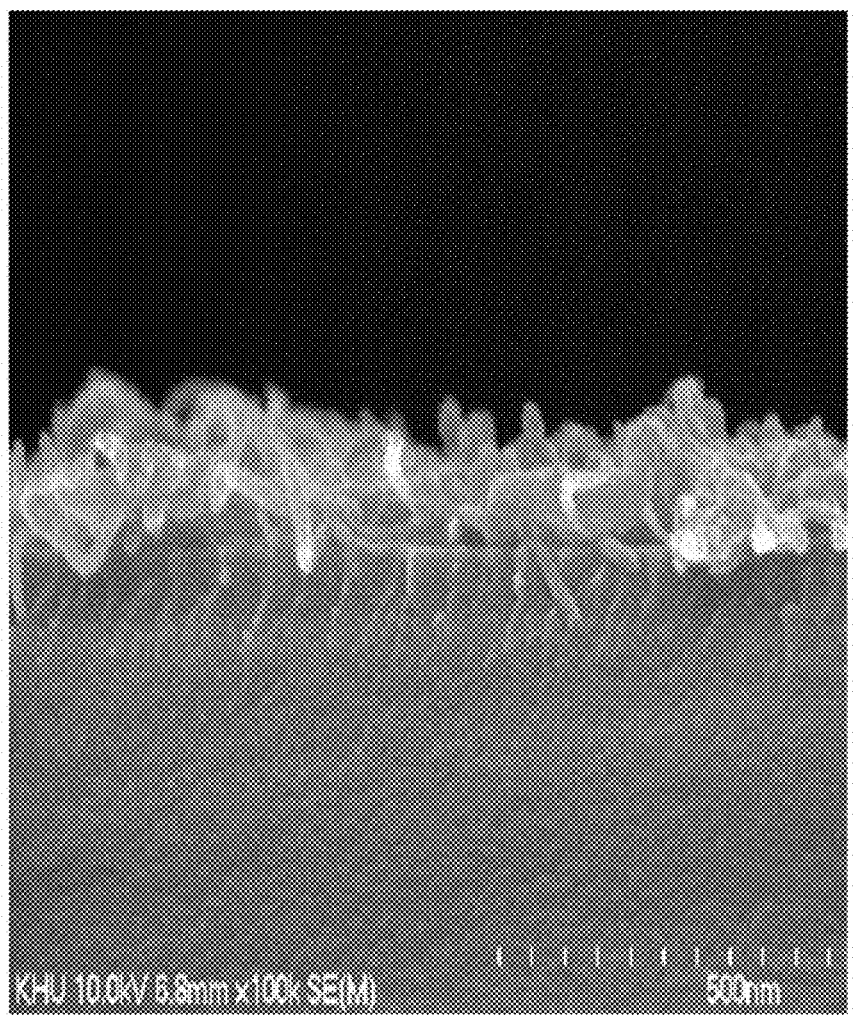

Referring to FIG. 2D, by the method of fabricating an oxide semiconductor thin film transistor according to an embodiment of the present disclosure, the carbon nanotubes may be formed to a thickness of about 150 nm on the oxide semiconductor layer.

Although the carbon nanotubes have been exemplified as having a thickness of 46 nm to 150 nm in the descriptions, the carbon nanotubes may be formed to a thickness of about 2 nm to about 150 nm.

Figure 3:
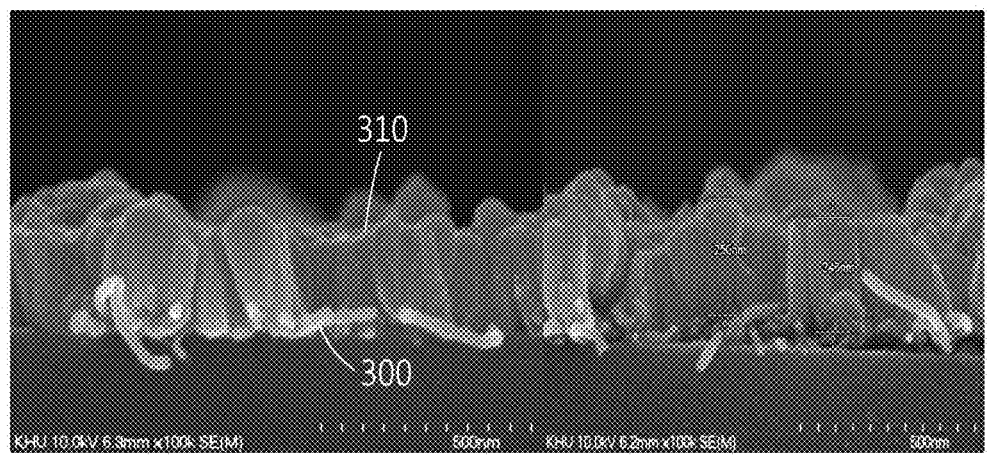
FIG. 3 illustrates an electron microscope image of an oxide semiconductor thin film transistor according to an embodiment of the present disclosure.

FIG. 3 illustrates an electron microscope image of an oxide semiconductor thin film transistor according to an embodiment of the present disclosure.

Referring to FIG. 3, in the method of fabricating an oxide semiconductor thin film transistor according to an embodiment of the present disclosure, carbon nanotubes 300 may be formed to a thickness of about 2 nm to about 150 nm, and a metal electrode 310 may be formed to a thickness of about 250 nn on the carbon nanotubes 300.

Accordingly, the oxide semiconductor thin film transistor according to an embodiment of the present disclosure may exhibit the same transfer characteristics as those of source and drain electrodes formed of only the metal electrode 310.

More particularly, in the method of fabricating an oxide semiconductor thin film transistor according to an embodiment of the present disclosure, the metal electrode 310 may be formed to a thickness of about 200 nm when the carbon nanotubes 300 are formed to a thickness of about 50 nm.

That is, by the method of fabricating an oxide semiconductor thin film transistor, source and drain electrodes wherein a ratio of the thickness of the carbon nanotubes to the thickness of the metal electrode is 1 to 4 may be formed.

Figure 4A:
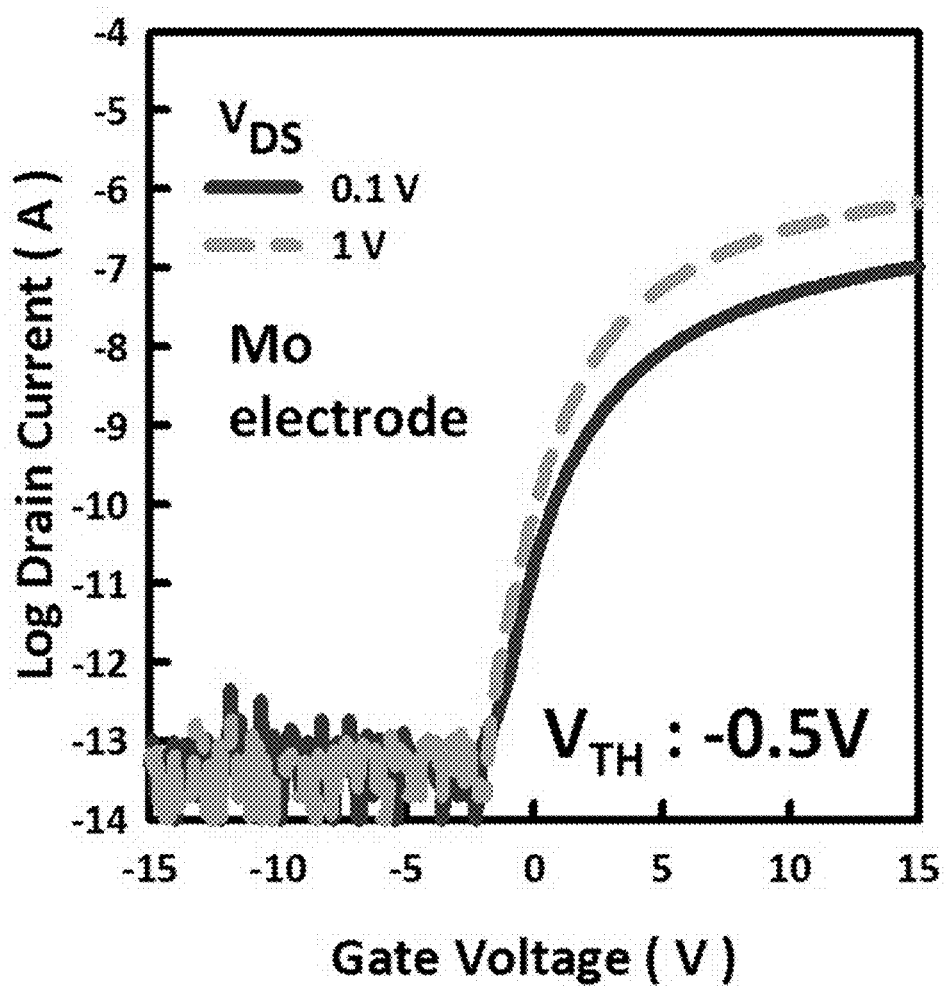
FIGS. 4A to 5B are graphs illustrating transfer characteristics of oxide semiconductor thin film transistors according to embodiments of the present disclosure.
Figure 4B:
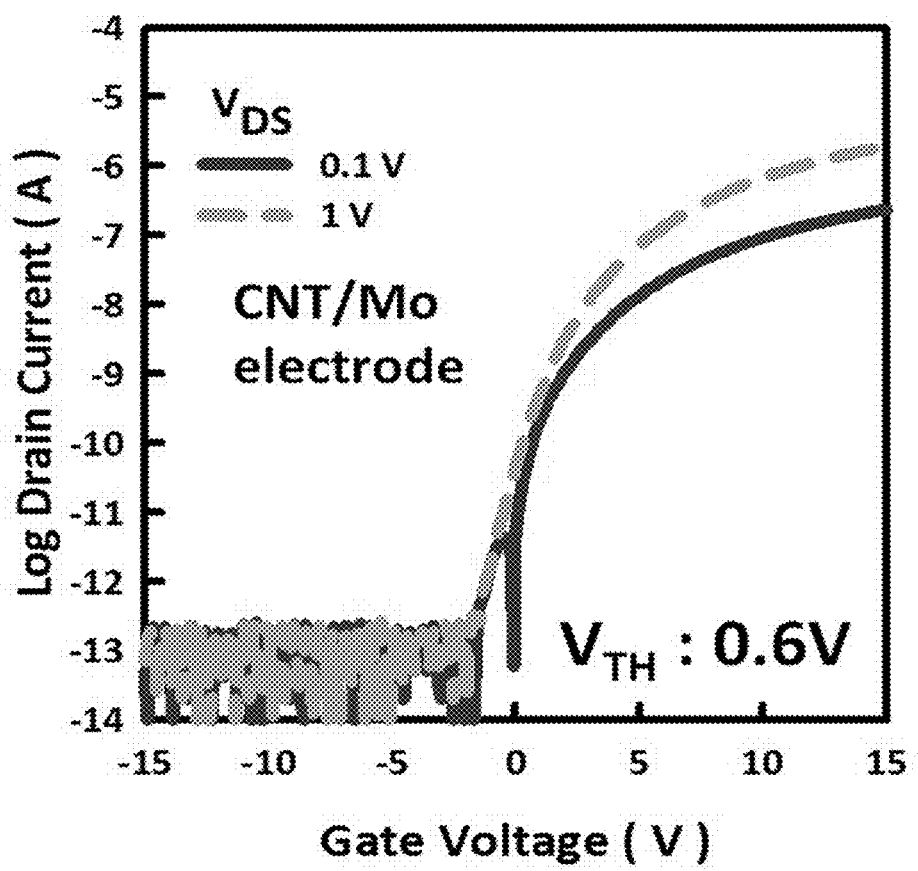

FIGS. 4A and 4B are graphs illustrating transfer characteristics of oxide semiconductor thin film transistors according to embodiments of the present disclosure.

FIG. 4A illustrates a transfer characteristic curve graph of an oxide semiconductor thin film transistor, source and drain electrodes of which were formed using a molybdenum disulfide electrode, and FIG. 4B illustrates a transfer characteristic curve graph of an oxide semiconductor thin film transistor, source and drain electrodes of which were formed using carbon nanotubes and a molybdenum disulfide electrode.

Referring to FIGS. 4A and 4B, the graphs represent transfer characteristic curves dependent upon a gate voltage and a drain current, and both graphs show that both oxide semiconductor thin film transistors have similar transfer characteristic graphs.

For example, a transfer characteristic curve is a graph of showing a relationship between input and output in a transistor and may also be referred to as a transfer curve.

Figure 5A:
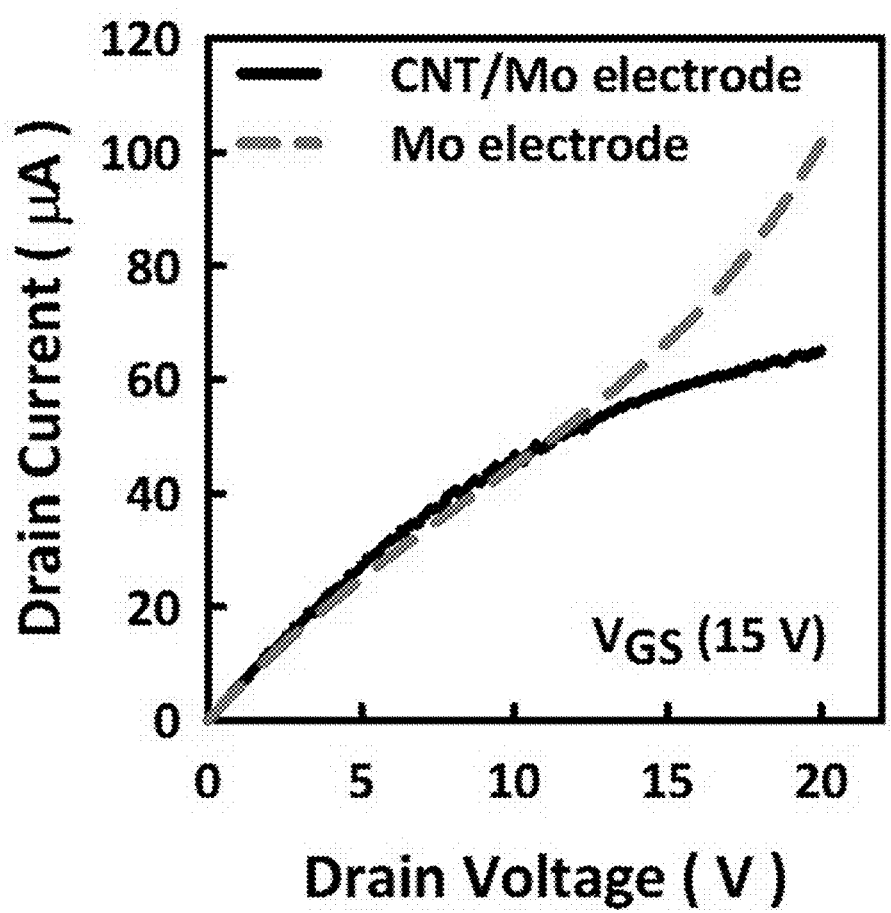
Figure 5B:
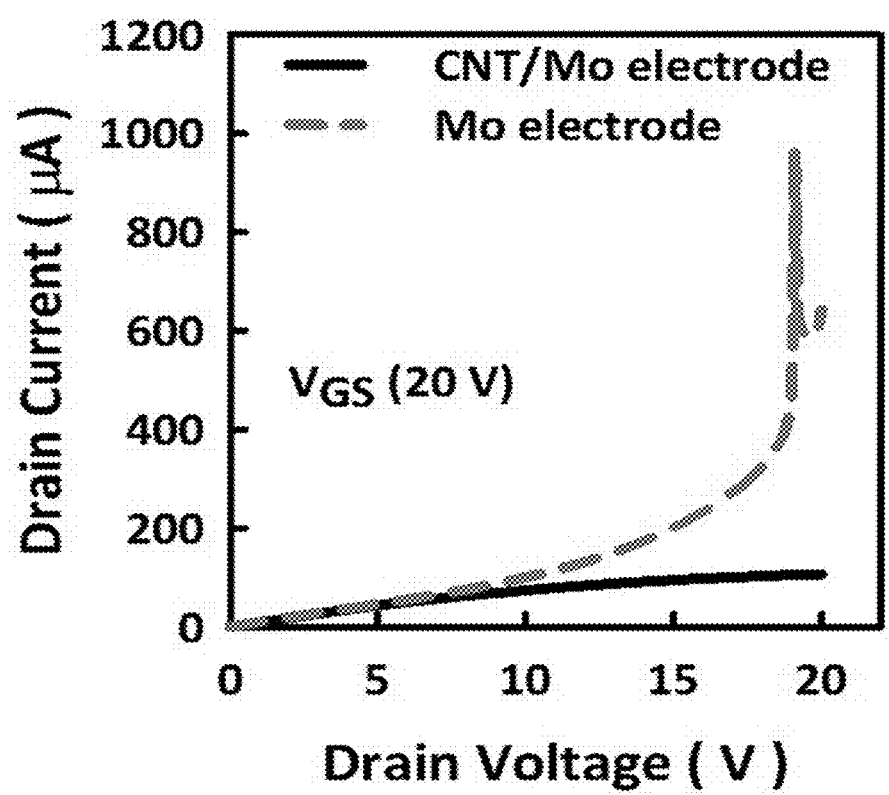

FIGS. 5A and 5B are graphs illustrating transfer characteristics of oxide semiconductor thin film transistors according to embodiments of the present disclosure.

FIGS. 5A and 5B respectively illustrate a transfer characteristic curve graph of an oxide semiconductor thin film transistor, source and drain electrodes of which were formed using a molybdenum disulfide electrode, and a transfer characteristic curve graph of an oxide semiconductor thin film transistor, source and drain electrodes of which were formed using carbon nanotubes and a molybdenum disulfide electrode.

Here, a gate voltage in FIG. 5A is 15 V, and a gate voltage in FIG. 5B is 20 V. Referring to FIGS. 5A and 5B, similar transfer characteristic curves are formed when a gate voltage is 15 V, but, when a gate voltage is increased to 20 V, the oxide semiconductor thin film transistor, the source and drain electrodes of which were formed using carbon nanotubes and a molybdenum disulfide electrode, exhibits relatively stable characteristics.

Figure 6A:
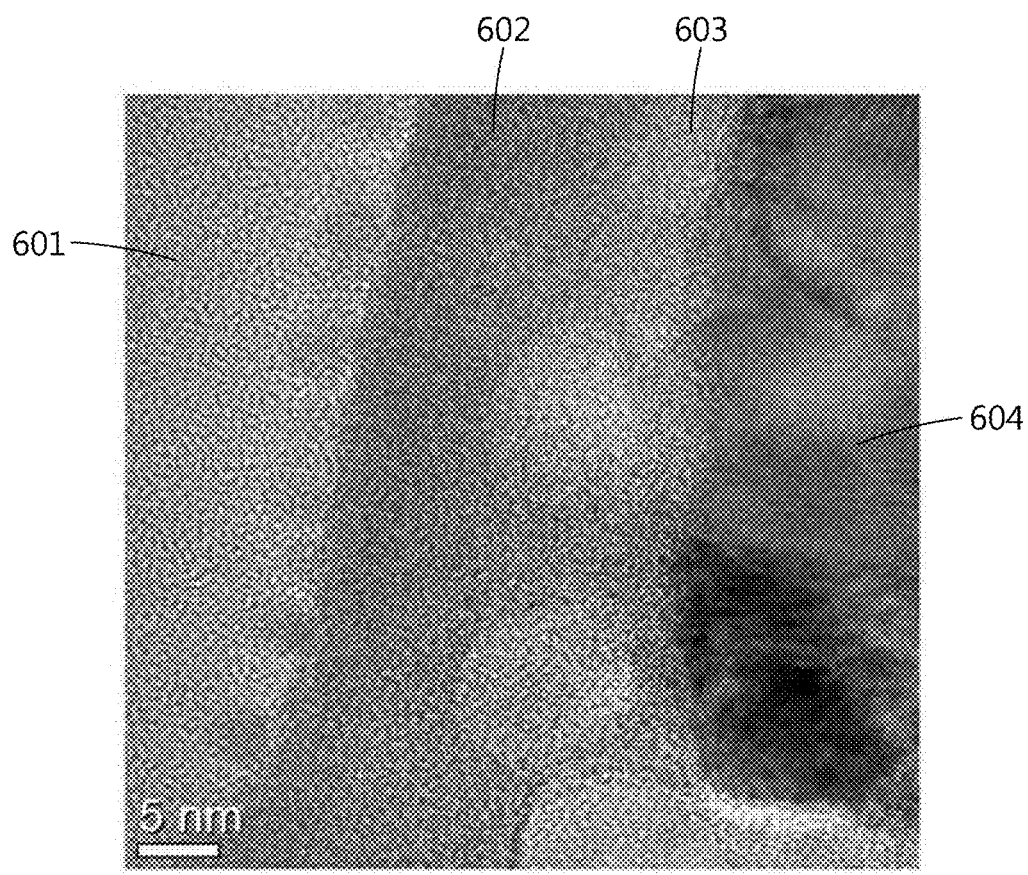
FIG. 6A illustrates an electron microscope image of an oxide semiconductor thin film transistor according to a conventional technology.
Figure 6B:
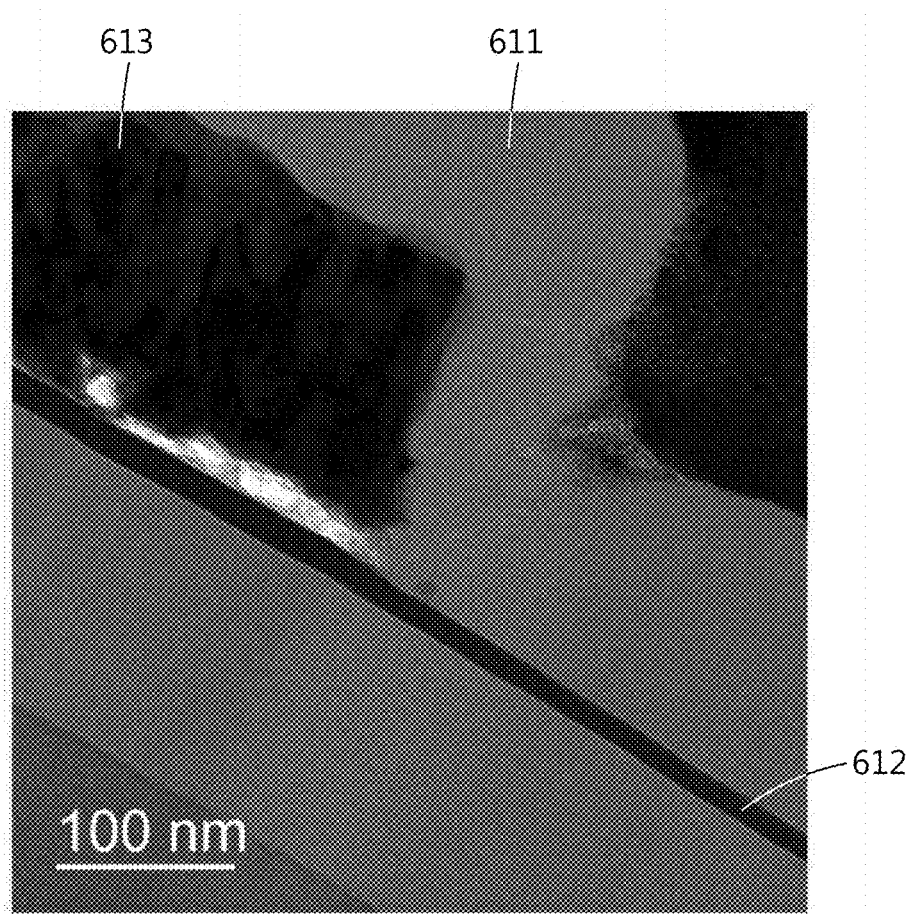
FIG. 6B illustrates an electron microscope image of an oxide semiconductor thin film transistor according to an embodiment of the present disclosure.

FIG. 6A illustrates an electron microscope image of an oxide semiconductor thin film transistor according to a conventional technology; and FIG. 6B illustrates an electron microscope image of an oxide semiconductor thin film transistor according to an embodiment of the present disclosure.

More particularly, FIG. 6A illustrates an electron microscope image of an oxide semiconductor thin film transistor, source and drain electrodes of which were formed using a molybdenum disulfide electrode, after being subjected to high current stress.

Meanwhile, FIG. 6B illustrates an electron microscope image of an oxide semiconductor thin film transistor, source and drain electrodes of which were formed using carbon nanotubes and a molybdenum disulfide electrode, after being subjected to high current stress.

Here, the high current stress may refer to an exotherm of about 400° C.

Referring to FIG. 6A, an oxide semiconductor thin film transistor according to a conventional technology includes a buffer layer 601, an oxide semiconductor layer 602, a metal diffusion layer 603, and a drain electrode 604.

Here, after applying high current stress to the conventional oxide semiconductor thin film transistor, the metal diffusion layer 603 is formed and a metal is diffused into the oxide semiconductor layer 602.

Meanwhile, referring to FIG. 6B, the oxide semiconductor thin film transistor according to an embodiment of the present disclosure includes a buffer layer 611, an oxide semiconductor layer 612, and a drain electrode 613 and, even after being subjected to high current stress, does not exhibit formation of a metal diffusion layer.

That is, in the case of the oxide semiconductor thin film transistor according to an embodiment of the present disclosure, the carbon nanotubes protect the drain electrode from a high temperature of about 400° C. thereby preventing a metal of the drain electrode from being diffused into the oxide semiconductor layer 612.

FIGS. 7A to 7D are curve graphs illustrating transfer characteristics of oxide semiconductor thin film transistors.

Figure 7A:
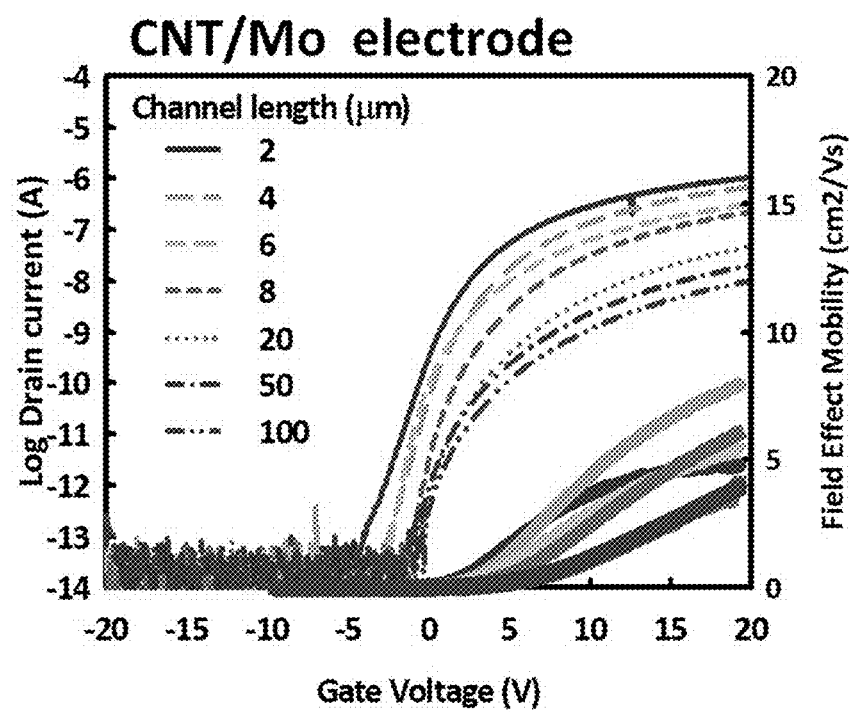
FIGS. 7A to 7D are curve graphs illustrating transfer characteristics of oxide semiconductor thin film transistors.
Figure 7B:
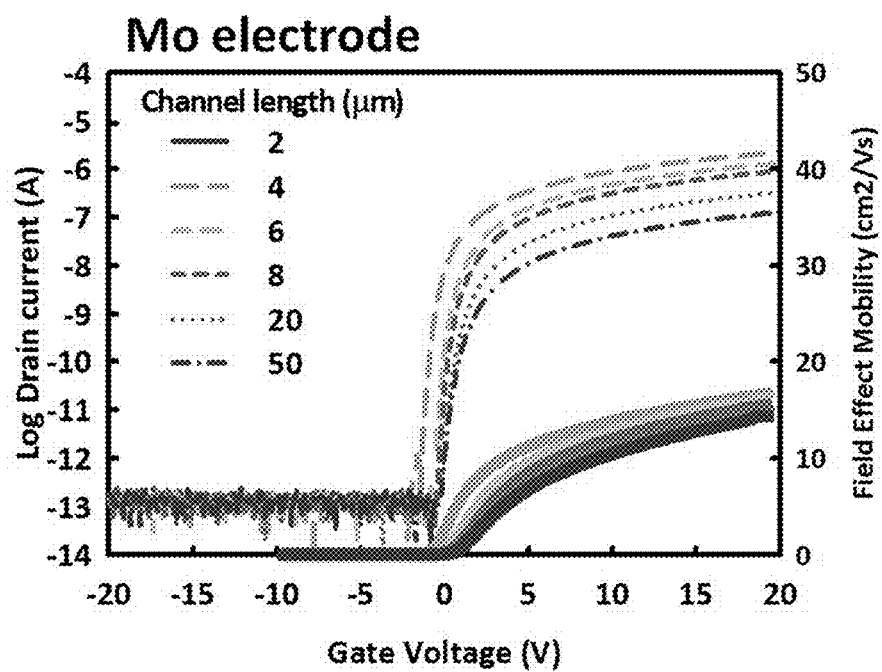

FIG. 7A illustrates channel length-dependent transfer characteristic curve graphs of oxide semiconductor thin film transistors, source and drain electrodes of which have been formed using carbon nanotubes and a molybdenum disulfide electrode, and FIG. 7B illustrates channel length-dependent transfer characteristic curve graphs of oxide semiconductor thin film transistors, source and drain electrodes of which have been formed using only a molybdenum disulfide electrode.

Figure 7C:
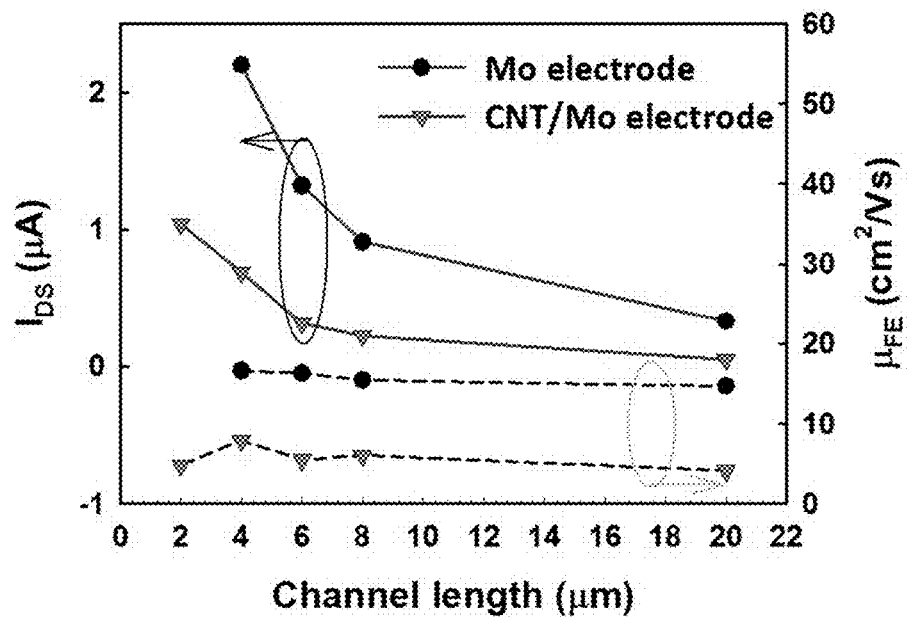

In addition, FIG. 7C illustrates drain current mobility-related graphs of an oxide semiconductor thin film transistor, source and drain electrodes of which have been formed using carbon nanotubes and a molybdenum disulfide electrode, and an oxide semiconductor thin film transistor, source and drain electrodes of which have been formed only using a molybdenum disulfide electrode.

Figure 7D:
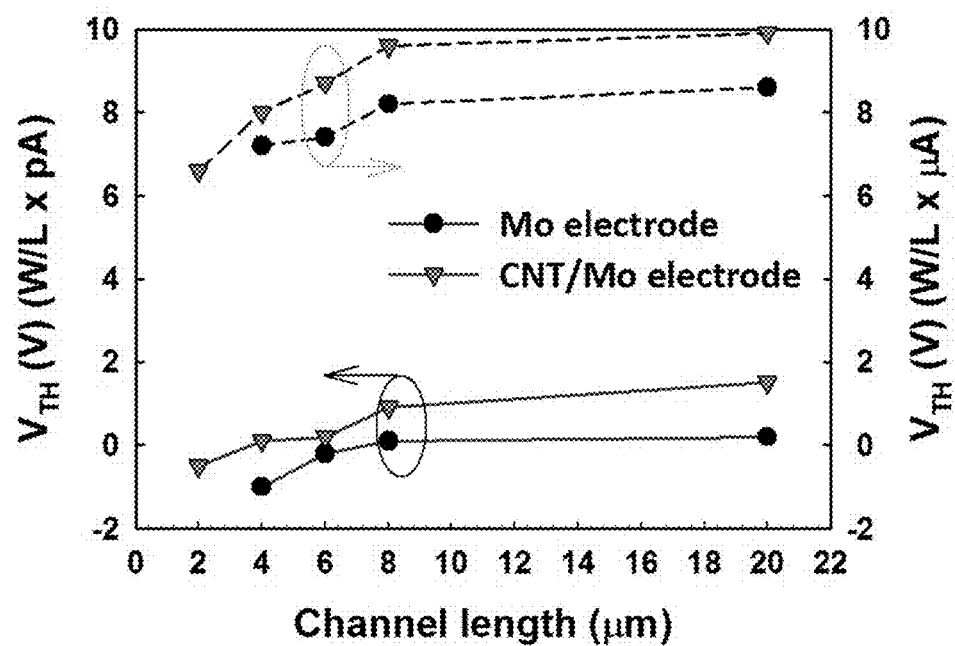

Meanwhile, FIG. 7D illustrates threshold voltages of an oxide semiconductor thin film transistor, source and drain electrodes of which have been formed using carbon nanotubes and a molybdenum disulfide electrode, and an oxide semiconductor thin film transistor, source and drain electrodes of which have been formed only using a molybdenum disulfide electrode.

FIGS. 8A to 8D illustrate all resistance graphs of oxide semiconductor thin film transistors.

Figure 8A:
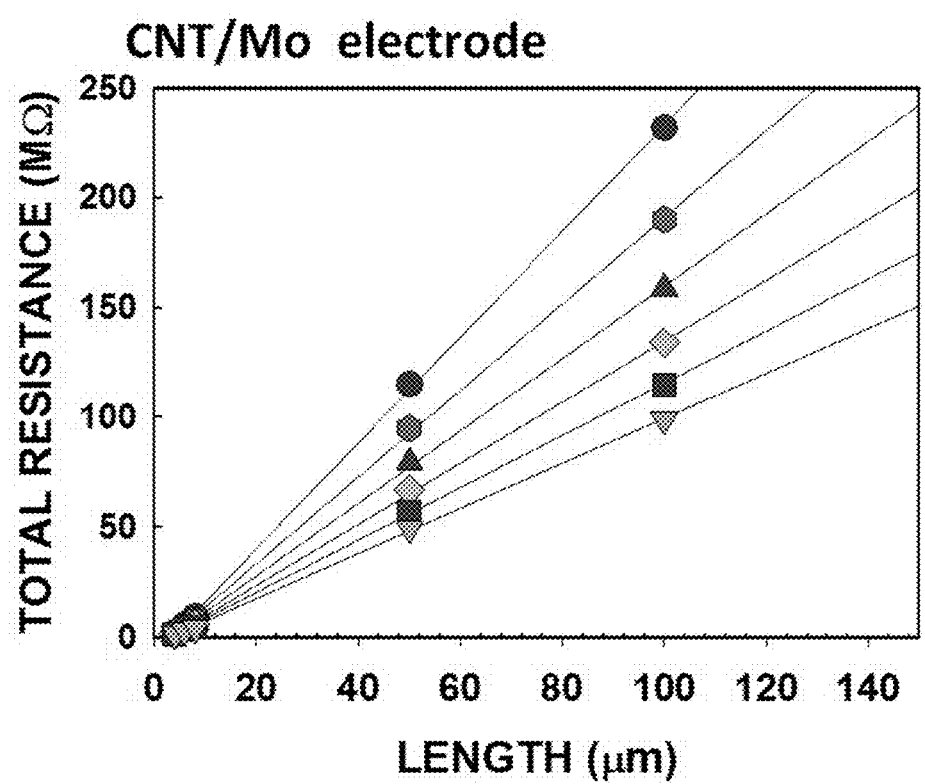
FIGS. 8A to 8D illustrate all resistance graphs of oxide semiconductor thin film transistors.
Figure 8B:
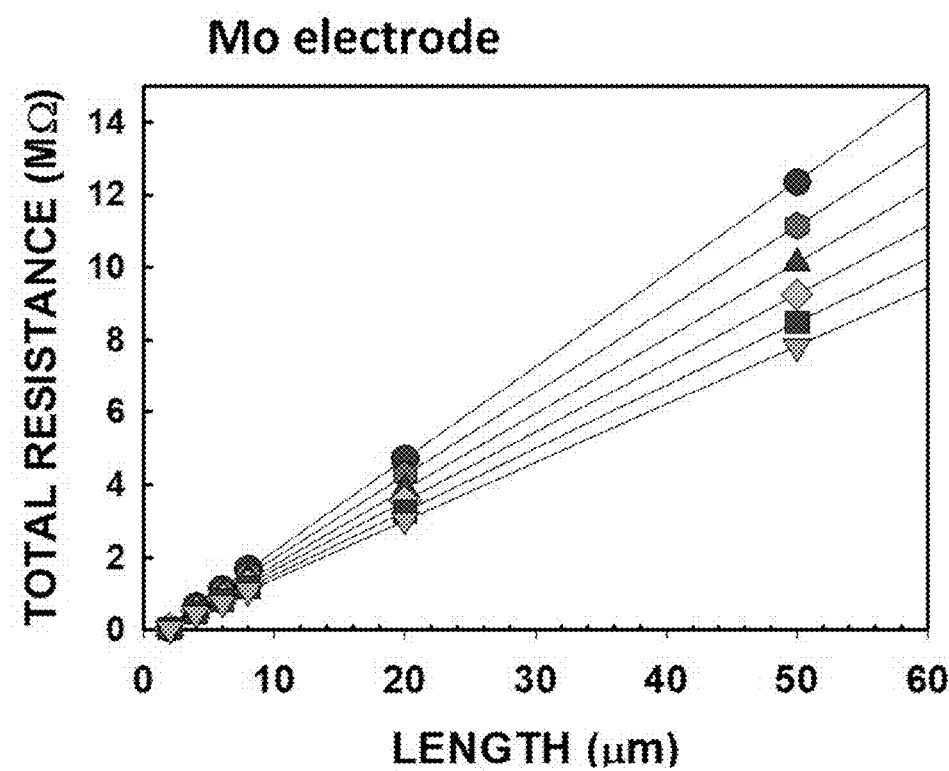

FIG. 8A illustrates total resistance-related graphs of oxide semiconductor thin film transistors, source and drain electrodes of which have been formed using carbon nanotubes and a molybdenum disulfide electrode, and FIG. 8b illustrates total resistance-related graphs of oxide semiconductor thin film transistors, source and drain electrodes of which have been formed only using a molybdenum disulfide electrode.

Figure 8C:
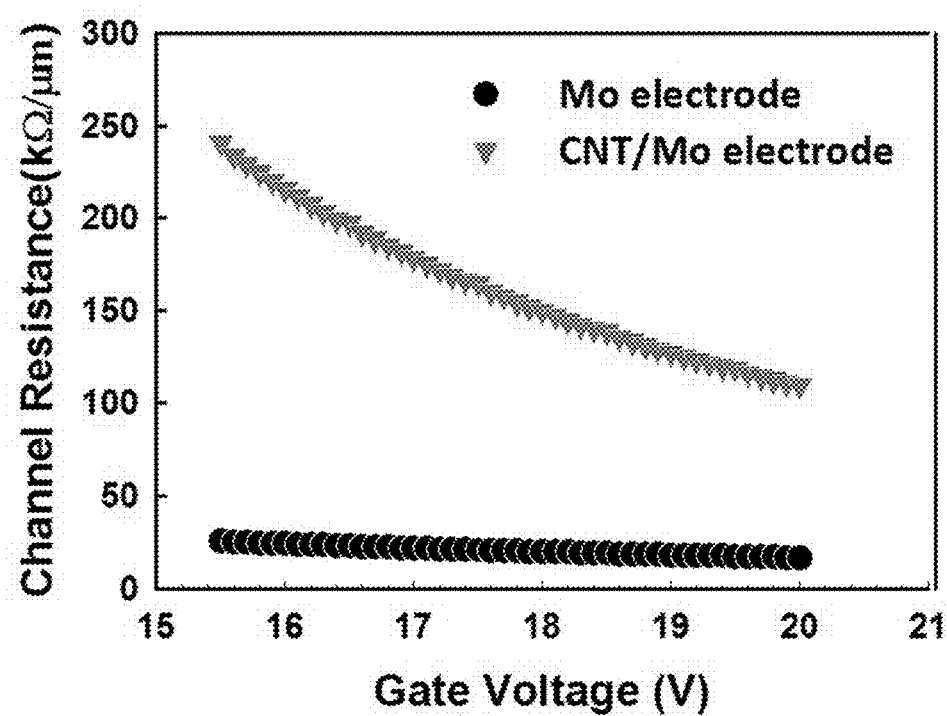

FIG. 8C illustrates channel resistance values of an oxide semiconductor thin film transistor, source and drain electrodes of which have been formed using carbon nanotubes and a molybdenum disulfide electrode, and an oxide semiconductor thin film transistor, source and drain electrodes of which have been formed only using a molybdenum disulfide electrode.

Figure 8D:
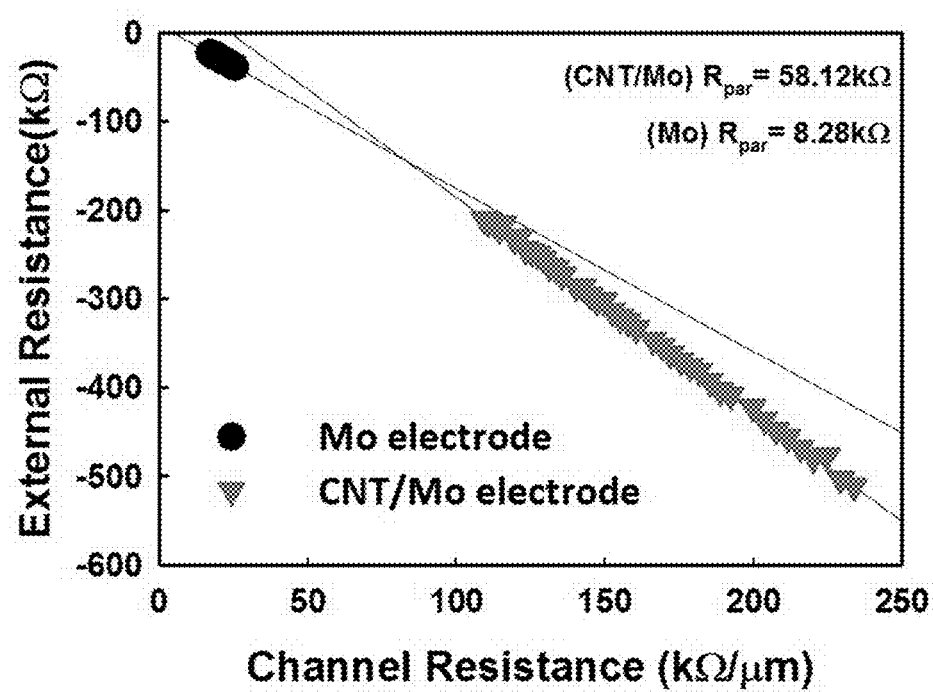

FIG. 8D illustrates parasitic resistance values of an oxide semiconductor thin film transistor, source and drain electrodes of which have been formed using carbon nanotubes and a molybdenum disulfide electrode, and an oxide semiconductor thin film transistor, source and drain electrodes of which have been formed only using a molybdenum disulfide electrode.

Figure 9:
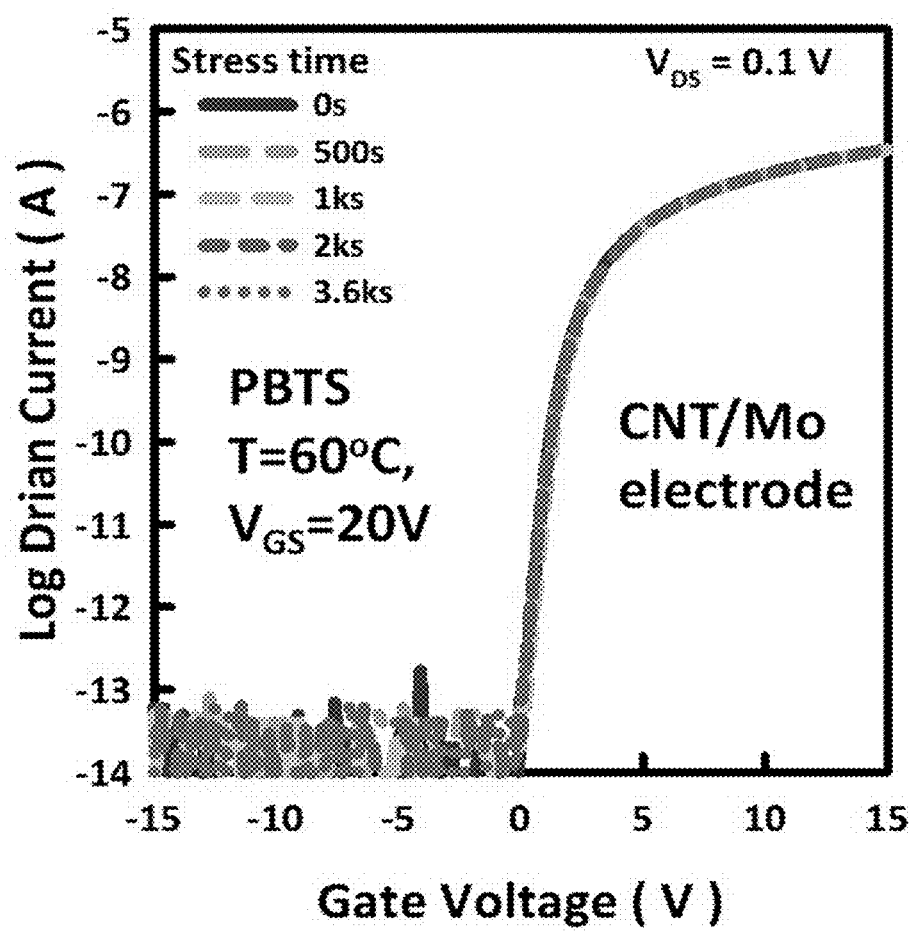
FIG. 9 is a graph illustrating an electrical characteristic of an oxide semiconductor thin film transistor according to an embodiment of the present disclosure.

FIG. 9 is a graph illustrating an electrical characteristic of an oxide semiconductor thin film transistor according to an embodiment of the present disclosure.

FIG. 9 illustrates an electrical characteristic of the oxide semiconductor thin film transistor according to an embodiment of the present disclosure in an environment of a positive voltage and 60° C.

For example, the positive voltage may correspond to about 20 V, and a time of stress corresponding to positive bias temperature stress (PBTS) may be observed in five separate steps. For example, the positive voltage may also be referred to as a gate voltage.

FIG. 10A to FIG. 10E are sectional views illustrating a flow of a method of fabricating an oxide semiconductor thin film transistor with a coplanar structure according to an embodiment of the present disclosure.

Figure 10A:
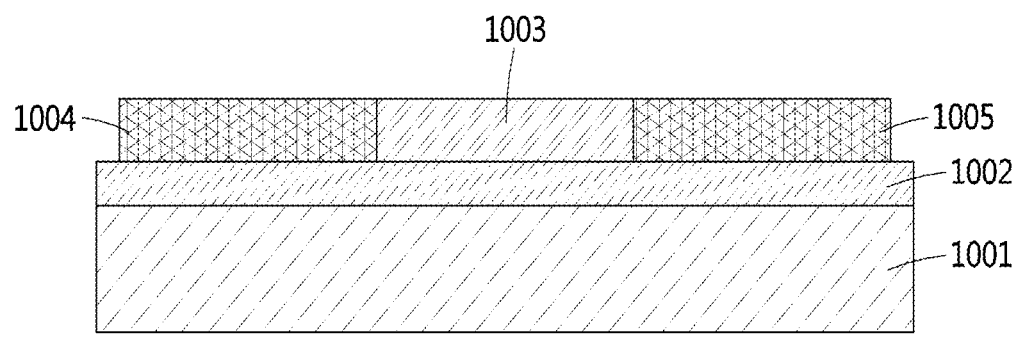
FIG. 10A to FIG. 10E are sectional views illustrating a flow of a method of fabricating an oxide semiconductor thin film transistor with a coplanar structure according to an embodiment of the present disclosure.

Referring to FIG. 10a, the oxide semiconductor thin film transistor with a coplanar structure according to an embodiment of the present disclosure may be formed by forming a buffer layer 1002 on a substrate 1001 and forming an oxide semiconductor layer 1003 on the buffer layer 1002.

For example, in method of fabricating the oxide semiconductor thin film transistor with a coplanar structure, a process of forming the oxide semiconductor layer 1003 may be performed referring to the process of FIG. 1C.

For example, in the method of fabricating the oxide semiconductor thin film transistor with a coplanar structure, an oxide thin film layer may be formed on the buffer layer 1002, and a doping concentration of an oxide thin film layer may be adjusted to form a first channel layer 1004 and a second channel layer 1005.

Figure 10B:
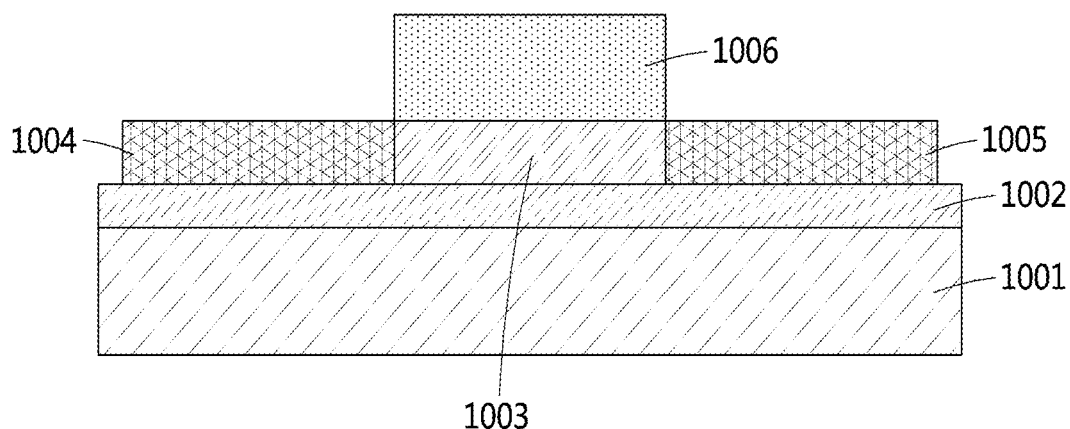

Referring to FIG. 10B, in the method of fabricating the oxide semiconductor thin film transistor with a coplanar structure, a gate insulator 1006 is formed on the oxide semiconductor layer 1003.

For example, in the method of fabricating the oxide semiconductor thin film transistor with a coplanar structure, the process of forming the gate insulator 1006 on the oxide semiconductor layer 1003 may be performed according to the method shown in FIG. 1D.

Figure 10C:
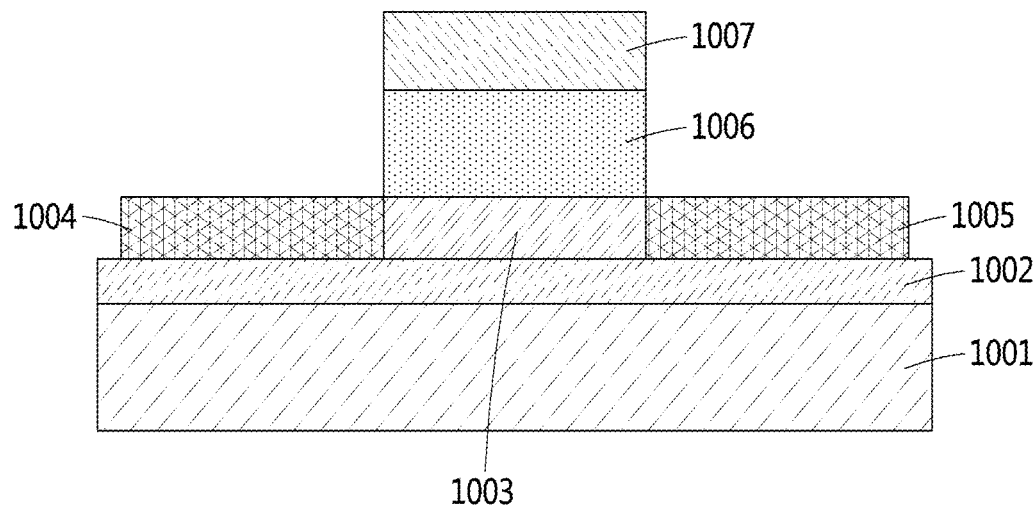

Referring to FIG. 10C, in the method of fabricating the oxide semiconductor thin film transistor with a coplanar structure, a first gate electrode 1007 may be formed on the gate insulator 1006.

For example, in the method of fabricating the oxide semiconductor thin film transistor with a coplanar structure, the process of forming the first gate electrode 1007 on the gate insulator 1006 may be performed according to the method shown in FIG. 1E.

Figure 10D:
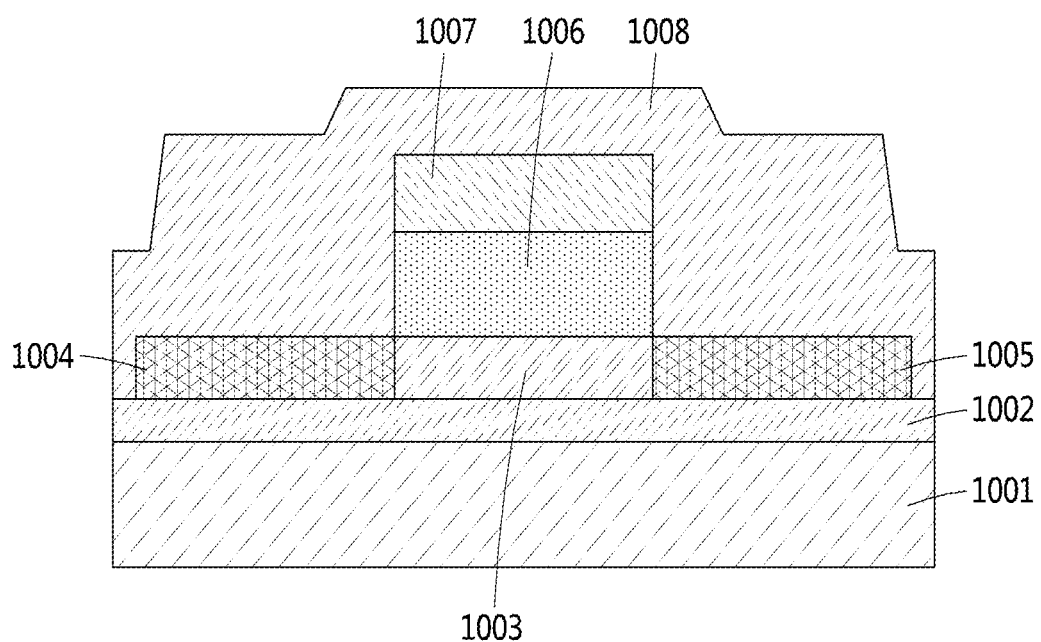

Referring to FIG. 10D, in the method of fabricating the oxide semiconductor thin film transistor with a coplanar structure, a passivation layer 1008 may be formed to cover all of the first channel layer 1004, the second channel layer 1005, and the first gate electrode 1007.

For example, in the method of fabricating the oxide semiconductor thin film transistor with a coplanar structure, the passivation layer 1008 may be formed in the same manner as the passivation layer formation method shown in FIG. 1F.

Figure 10E:
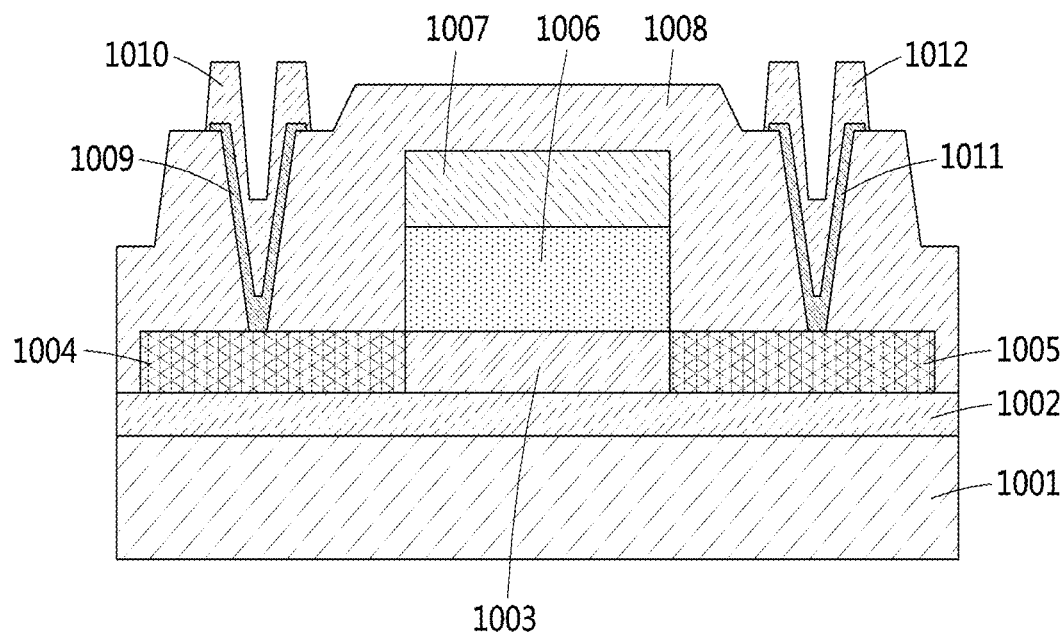

Referring to FIG. 10E, in the method of fabricating the oxide semiconductor thin film transistor with a coplanar structure, two holes may be formed in a passivation layer 1008, and source electrodes 1009 and 1010 and drain electrodes 1011 and 1012 may be formed though the formed holes.

For example, the source electrodes 1009 and 1010 may include carbon nanotubes 1009 and a metal electrode 1010.

In addition, the drain electrodes 1011 and 1012 may also include carbon nanotubes 1011 and a metal electrode 1012.

Figure 11:
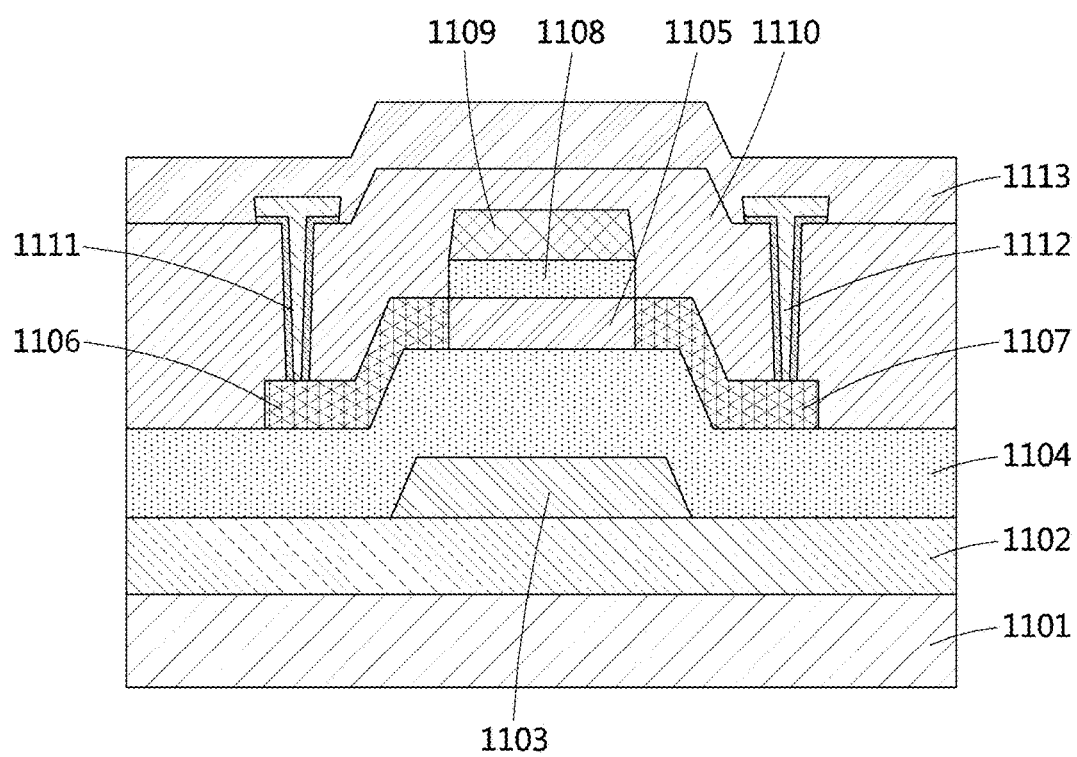
FIG. 11 illustrates a sectional view of an oxide semiconductor thin film transistor with a dual gate-based coplanar structure according to an embodiment of the present disclosure.

FIG. 11 illustrates a sectional view of an oxide semiconductor thin film transistor with a dual gate-based coplanar structure according to an embodiment of the present disclosure.

Referring to FIG. 11, the oxide semiconductor thin film transistor according to an embodiment of the present disclosure may have a dual gate-based coplanar structure.

The dual gate-based coplanar structure according to an embodiment of the present disclosure may include a substrate 1101, a second gate electrode 1103 formed on a buffer layer 1102, a gate insulator 1104 formed on the second gate electrode 1103, an oxide semiconductor layer 1105 formed on the gate insulator 1104, source and drain electrodes 1106 and 1107 formed next to the oxide semiconductor layer 1105, a gate insulator 1108 formed on the oxide semiconductor layer 1105, a first gate electrode 1109 formed on the gate insulator 1108, an inner insulating layer 1110 formed on the first gate electrode 1109, a source electrode 1111 formed through a hole, a drain electrode 1112 formed through a hole, and a passivation layer 1113.

For example, the source electrode 1111 may grow from the source electrode 1106, and the drain electrode 1112 may grow from the drain electrode 1107.

For example, the source electrode 1111 and the drain electrode 1112 may include carbon nanotubes, thereby preventing property deterioration due to heat.

The oxide semiconductor thin film transistor with a dual gate-based coplanar structure according to an embodiment of the present disclosure may include the components of the oxide semiconductor thin film transistor according to an embodiment of the present disclosure described above. Accordingly, descriptions of the same components are omitted.

The substrate 1101 serves to support various components of the oxide semiconductor thin film transistor, and may be a substrate having flexibility.

The second gate electrode 1103 is formed on the substrate 1101 and may be a bottom gate electrode.

The gate insulator 1104 is formed on the second gate electrode 1103. According to an embodiment, the buffer layer 1102 may be formed under the second gate electrode 1103, and the gate insulator 1104 may be formed on the second gate electrode 1103. Here, the buffer layer 1102 may function as a gate insulating film.

The buffer layer 1102 may prevent penetration of external impurities such as moisture or oxygen through the substrate 1101, and may flatten a surface of the substrate 1101. However, the buffer layer 1102 is not an essential component, and may be adopted or omitted depending upon the type of the substrate 1101.

The oxide semiconductor layer 1105 may be formed on the substrate 1101 on which the gate insulator 1104 has been formed.

In addition, the source and drain electrodes 1106 and 1107 may be formed on the gate insulator 1104 and the oxide semiconductor layer 1105.

The source and drain electrodes 1106 and 1107 may be formed on the gate insulator 1104 and may be spaced apart from each other to be respectively, electrically connected to the oxide semiconductor layer 1105.

The gate insulator 1108 may be formed on the source and drain electrodes 1106 and 1107, and the first gate electrode 1109 may be formed on the gate insulator 1108.

The first gate electrode 1109 may be formed on the gate insulator 1108 to correspond to the oxide semiconductor layer 1105. The first gate electrode 1109 may be a top gate electrode.

For example, it may refer to forming the first gate electrode 1109 to correspond to the oxide semiconductor layer 1105 to design semiconductor devices corresponding to each other as in a structure of blocks corresponding to each other in a sectional view.

The dual gate-based coplanar structure according to an embodiment of the present disclosure may be utilized to drive a display apparatus, particularly a pixel element of a flexible display apparatus, for example, an organic light emitting device.

According to another embodiment of the present disclosure, the oxide semiconductor thin film transistor with a dual gate-based coplanar structure may further include a connection electrode configured to electrically connect the first gate electrode 1109 and the second gate electrode 1103.

FIGS. 12A to 13D illustrate electrical characteristics of oxide semiconductor thin film transistors with a coplanar structure according to embodiments of the present disclosure.

Figure 12A:
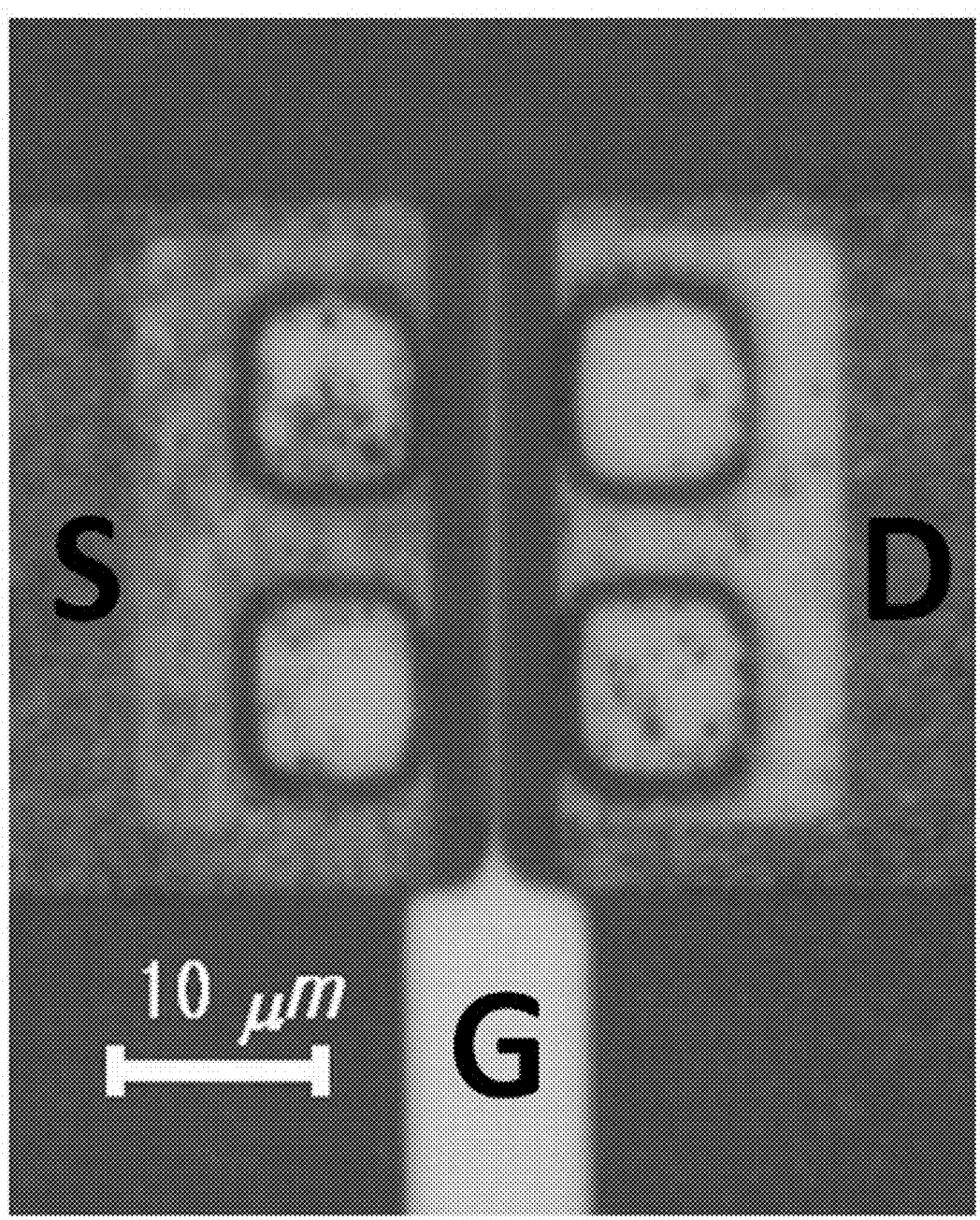
FIGS. 12A to 13D illustrate electrical characteristics of oxide semiconductor thin film transistors with a coplanar structure according to embodiments of the present disclosure.

FIG. 12A illustrates a sectional view of a coplanar structure of the oxide semiconductor transistor according to an embodiment of the present disclosure.

Referring to FIG. 12A, a gate electrode is formed between a source electrode and a drain electrode, and carbon nanotubes are formed at edges of the source and drain electrodes.

Figure 12B:
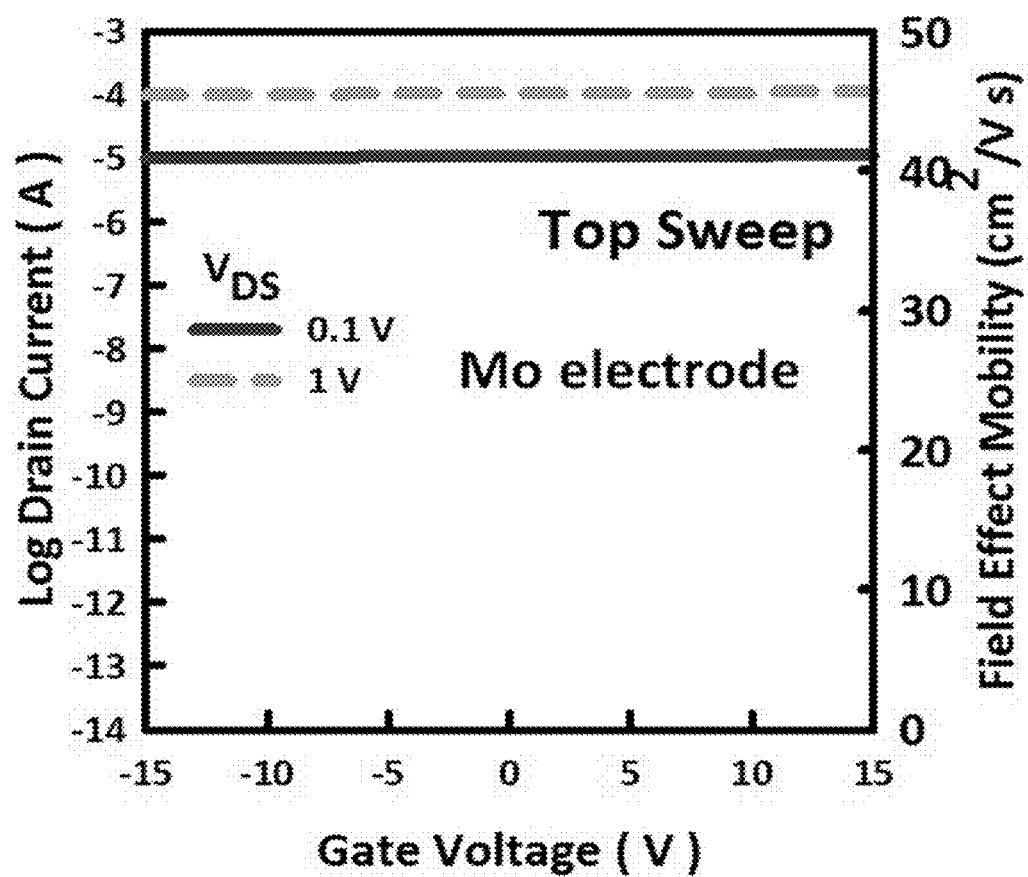
Figure 12C:
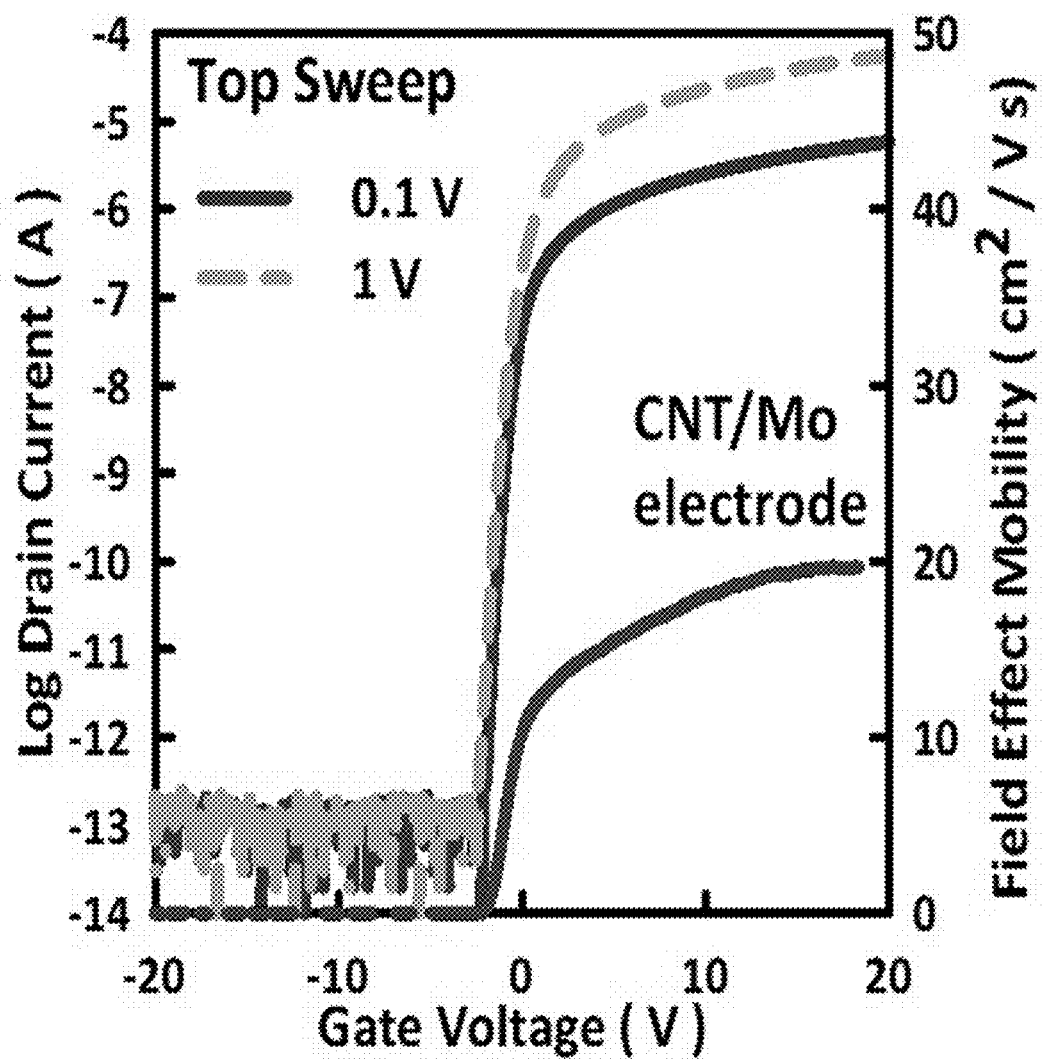

FIG. 12b illustrates −15 to 15 V top sweep of an oxide semiconductor thin film transistor, source and drain electrodes of which have been formed only using a molybdenum disulfide electrode, and FIG. 12c illustrates 15 to 15 V top sweep of an oxide semiconductor thin film transistor, source and drain electrodes of which have been formed using carbon nanotubes and a molybdenum disulfide electrode.

Figure 13A:
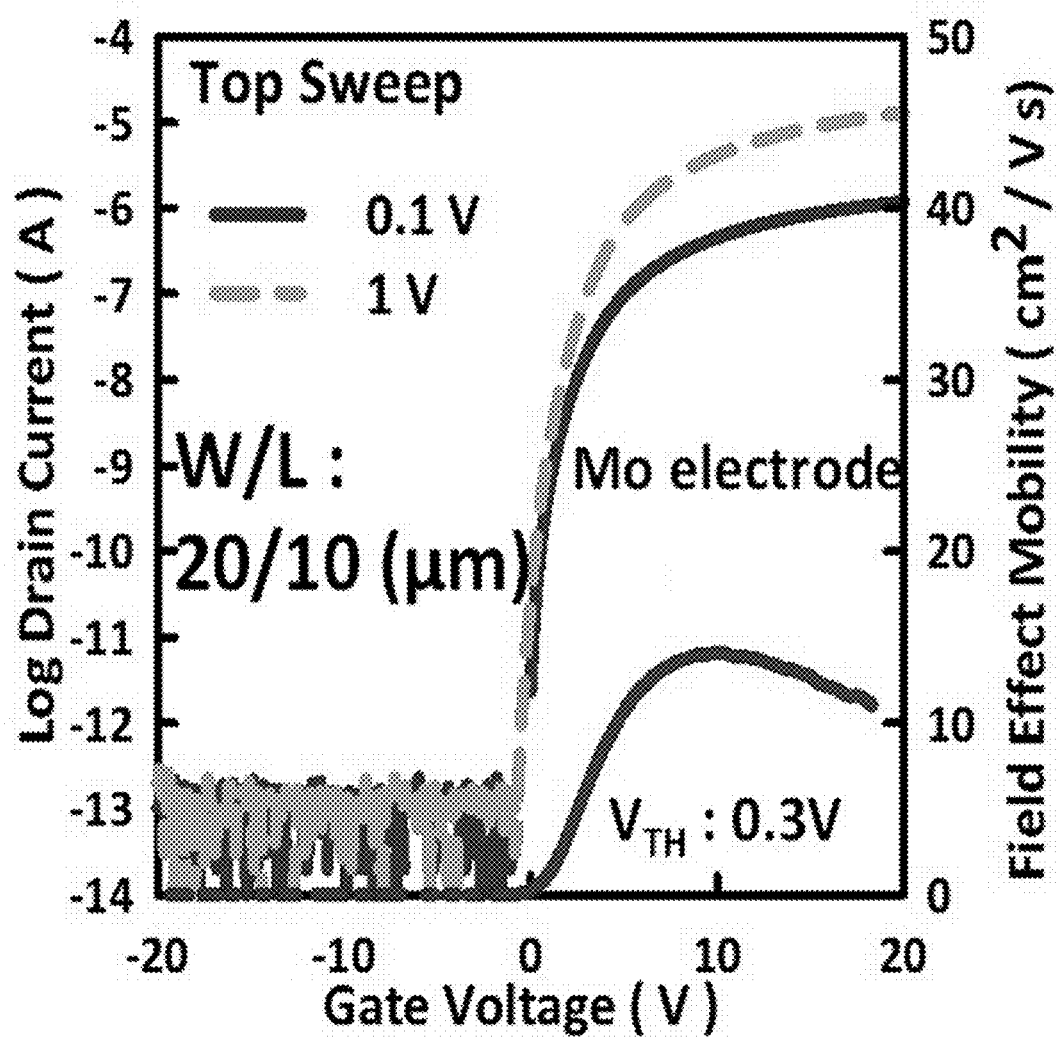

In addition, FIG. 13A illustrates graphs related to −20 to 20 V top sweep of an oxide semiconductor thin film transistor with a coplanar structure, which has a channel length of 10 μm and source and drain electrodes of which have been formed only using a molybdenum disulfide electrode.

Figure 13B:
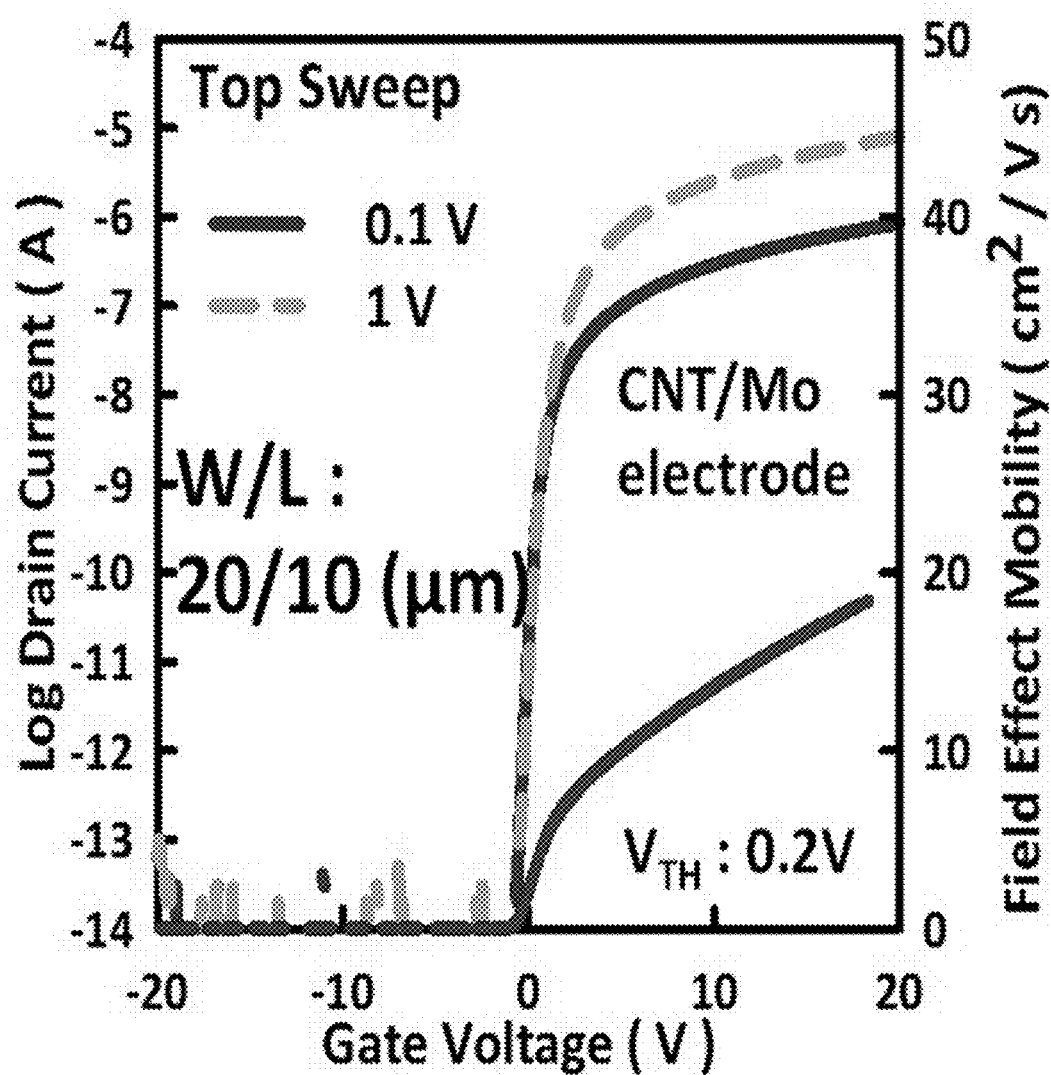

In addition, FIG. 13B illustrates graphs related to −20 to 20 V top sweep of an oxide semiconductor thin film transistor with a coplanar structure, which has a channel length of 10 μm and source and drain electrodes of which have been formed using carbon nanotubes and a molybdenum disulfide electrode.

Figure 13C:
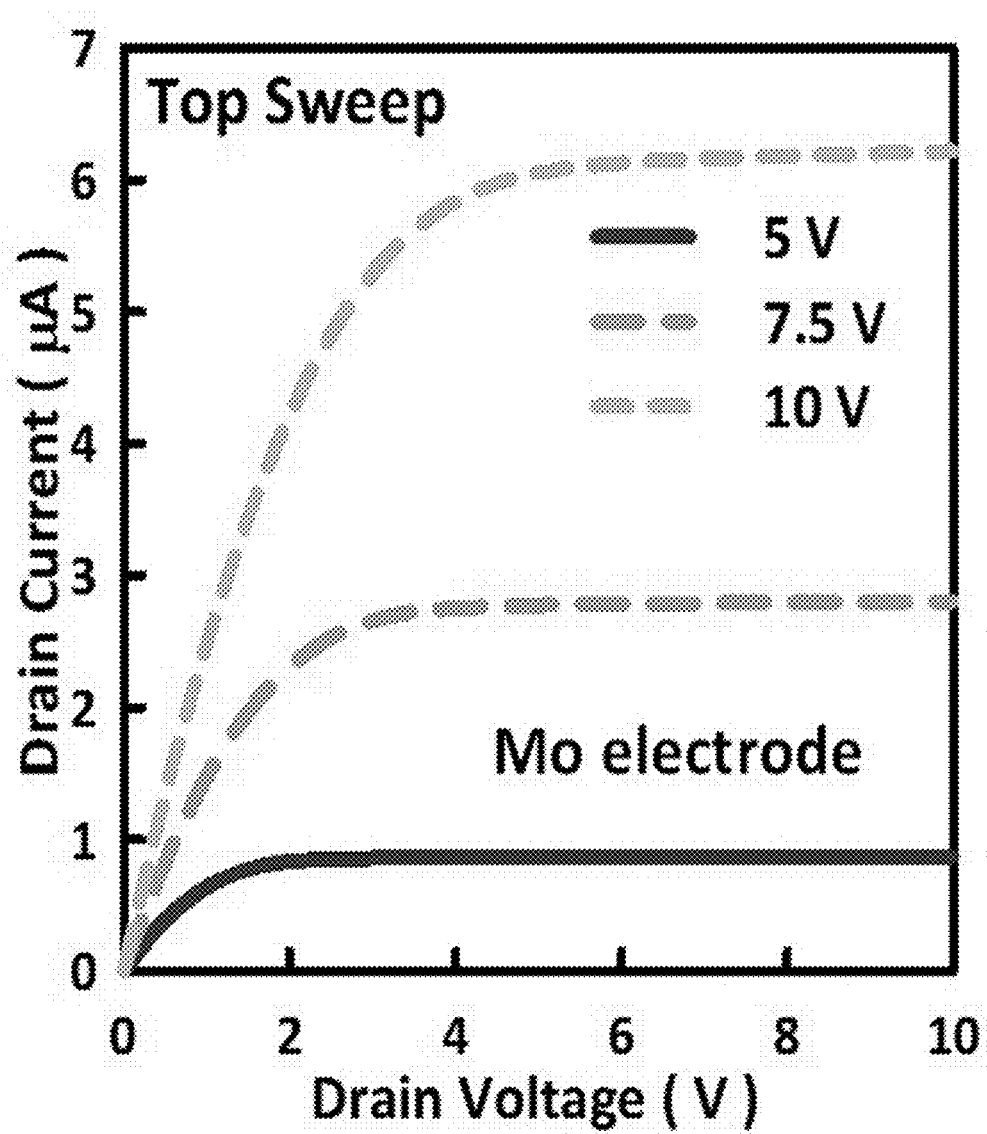

In addition, FIG. 13C illustrates graphs related to drain voltage outputs of an oxide semiconductor thin film transistor with a coplanar structure, which has a channel length of 10 μm and source and drain electrodes of which have been formed only using a molybdenum disulfide electrode.

Figure 13D:
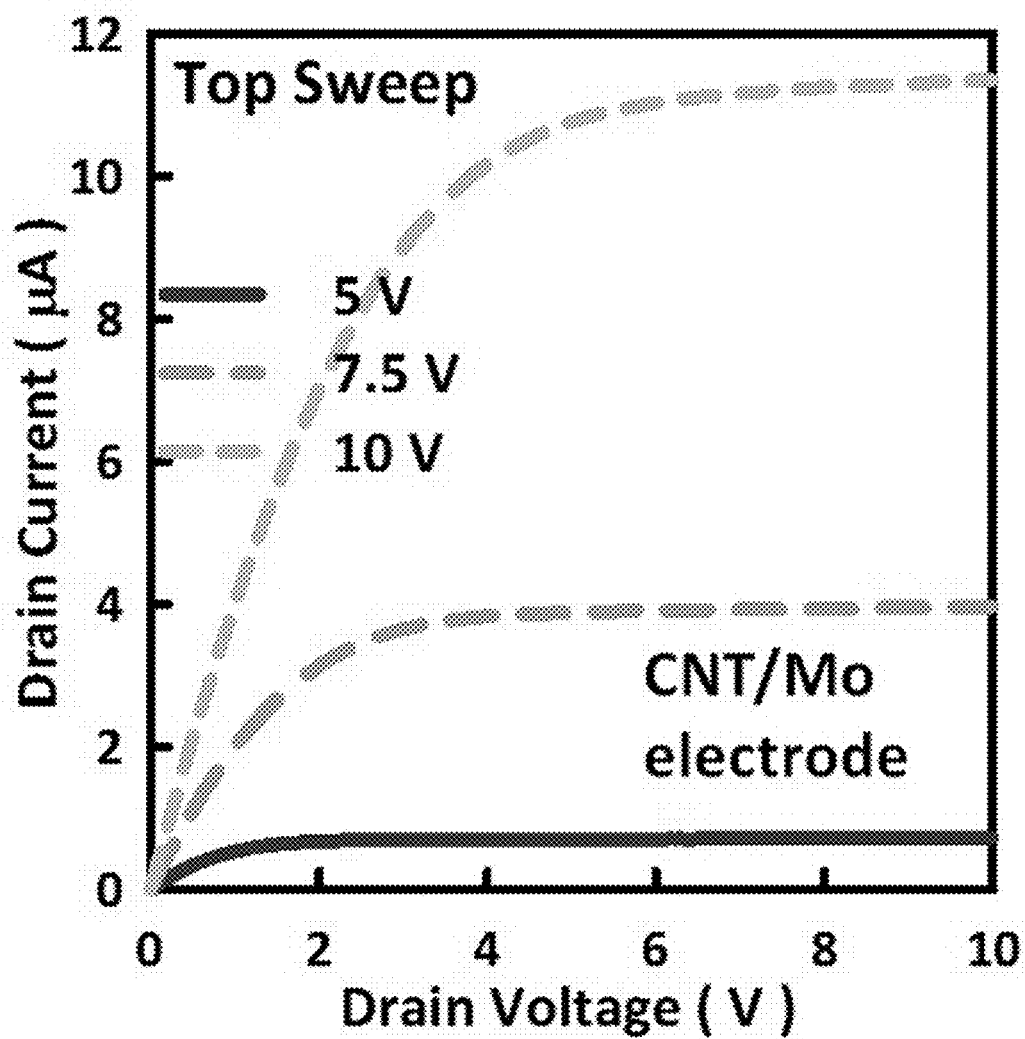

In addition, FIG. 13D illustrates graphs related to drain voltage outputs of an oxide semiconductor thin film transistor with a coplanar structure, which has a channel length of 10 μm and source and drain electrodes of which have been formed using carbon nanotubes and a molybdenum disulfide electrode.

FIGS. 14A to 15F illustrate electrical characteristics of oxide semiconductor thin film transistors with a dual gate-based coplanar structure according to embodiments of the present disclosure.

Figure 14A:
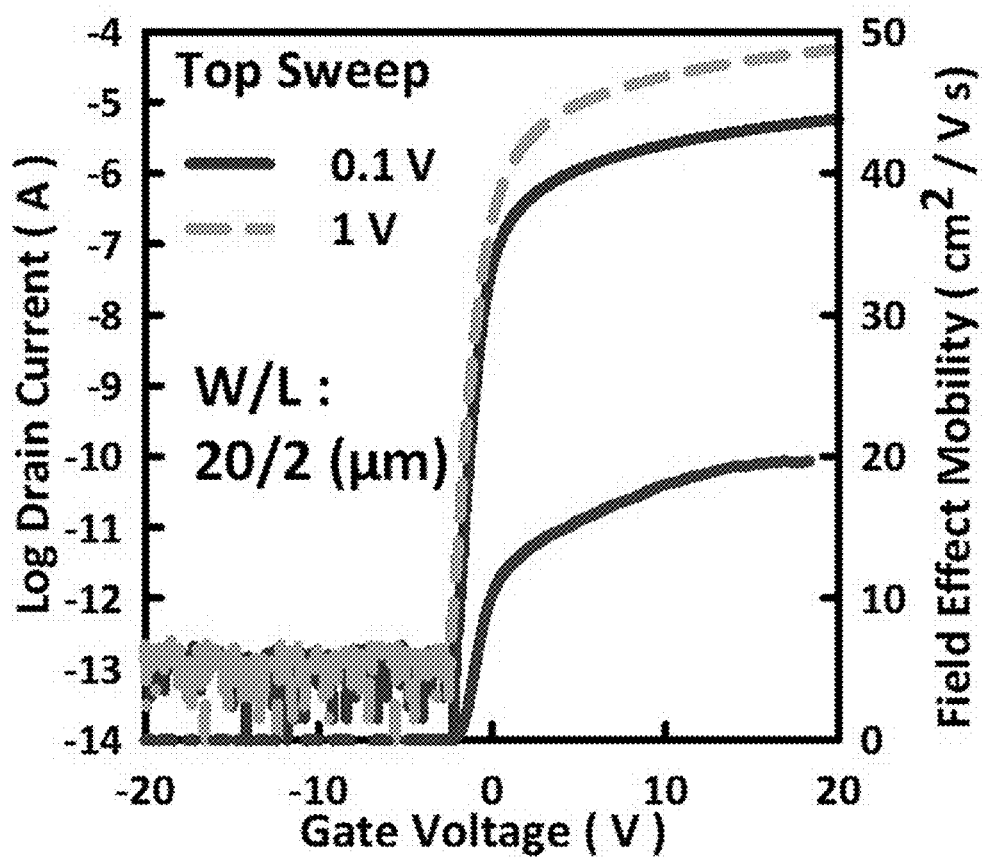
FIGS. 14A to 15F illustrate electrical characteristics of oxide semiconductor thin film transistors with a dual gate-based coplanar structure according to embodiments of the present disclosure.
Figure 14B:
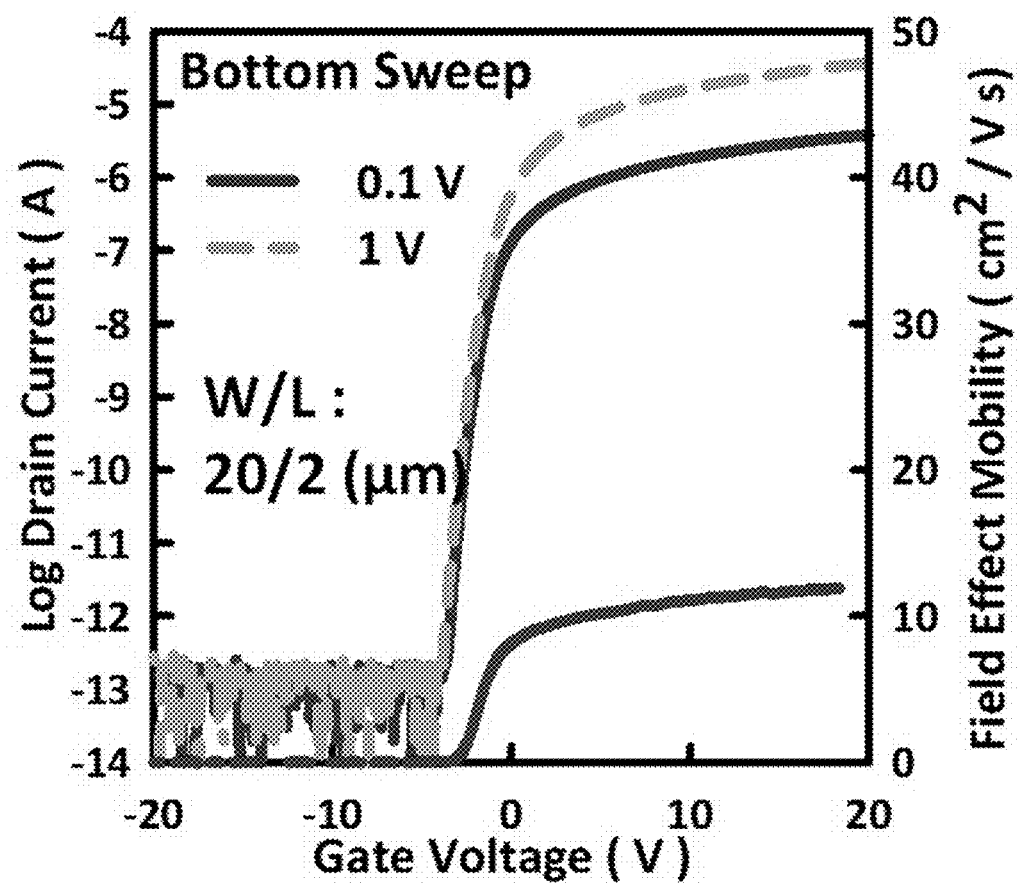
Figure 14C:
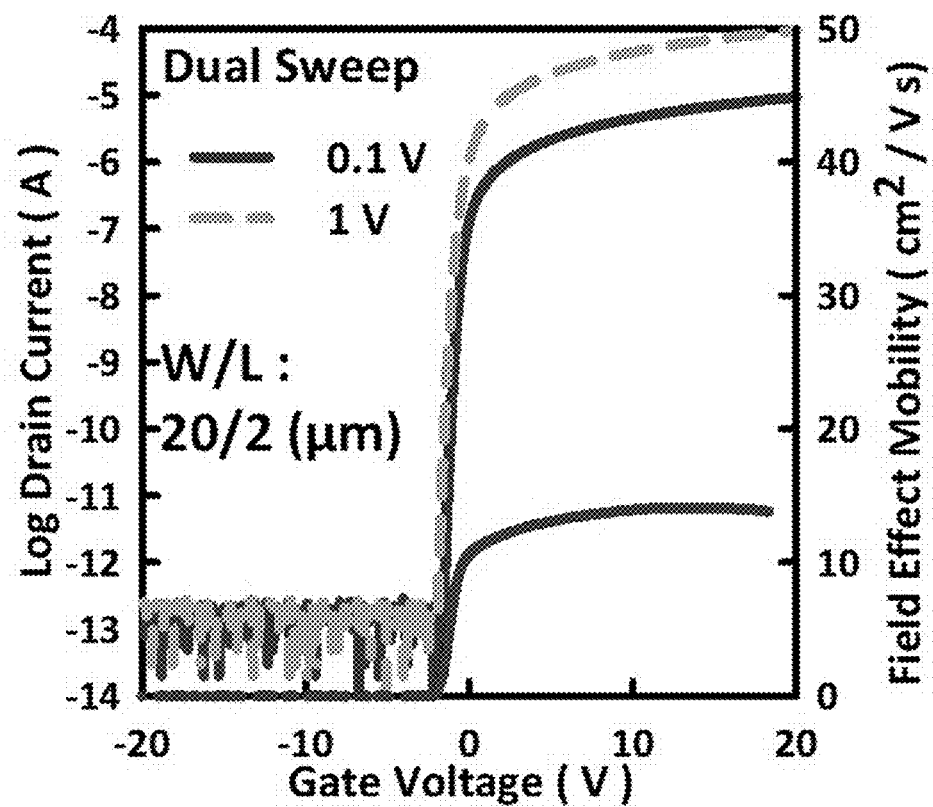

FIG. 14A illustrates the distribution of electrons and a current flow when a channel length is 2 μm, a second gate electrode is subjected to −20 V to 20 V sweep (top sweep), and a first gate electrode is grounded, FIG. 14B illustrates the distribution of electrons and a current flow when a channel length is 2 μm, a first gate electrode is subjected to −20 V to 20 V sweep (bottom sweep), and a second gate electrode is grounded, and FIG. 14C illustrates when a channel length is 2 μm and first and second gate electrodes are electrically or physically connected and thus are simultaneously subjected to −20 V to 20 V sweep (dual sweep).

Figure 14D:
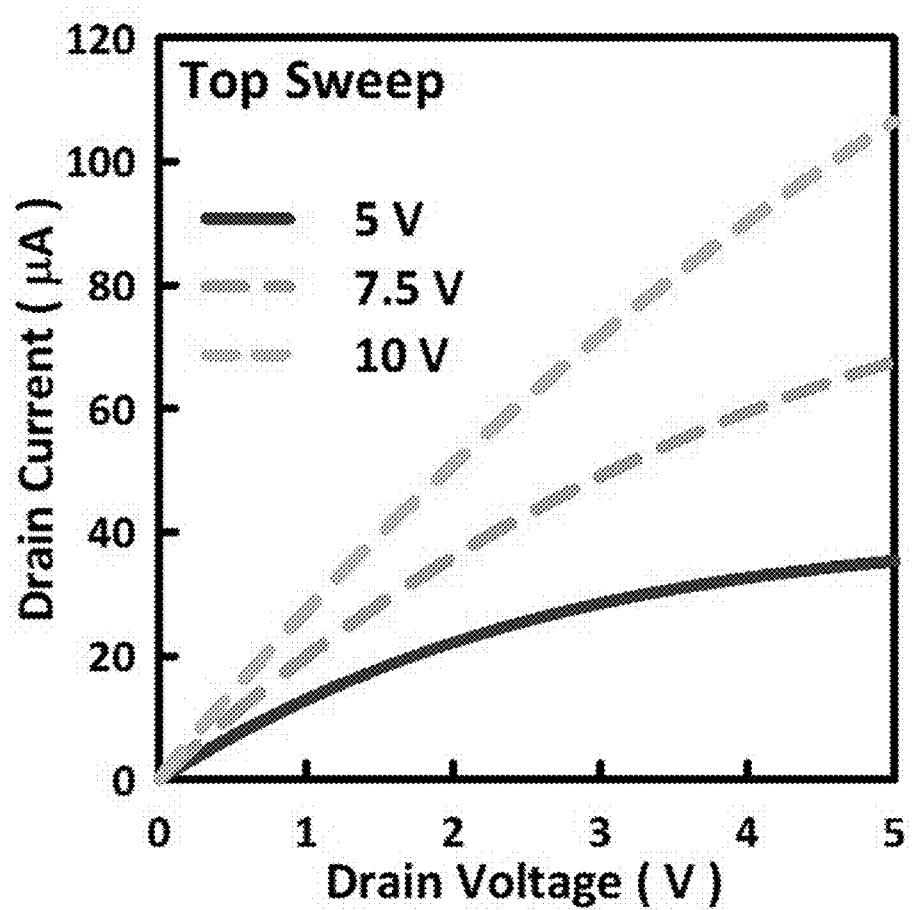
Figure 14E:
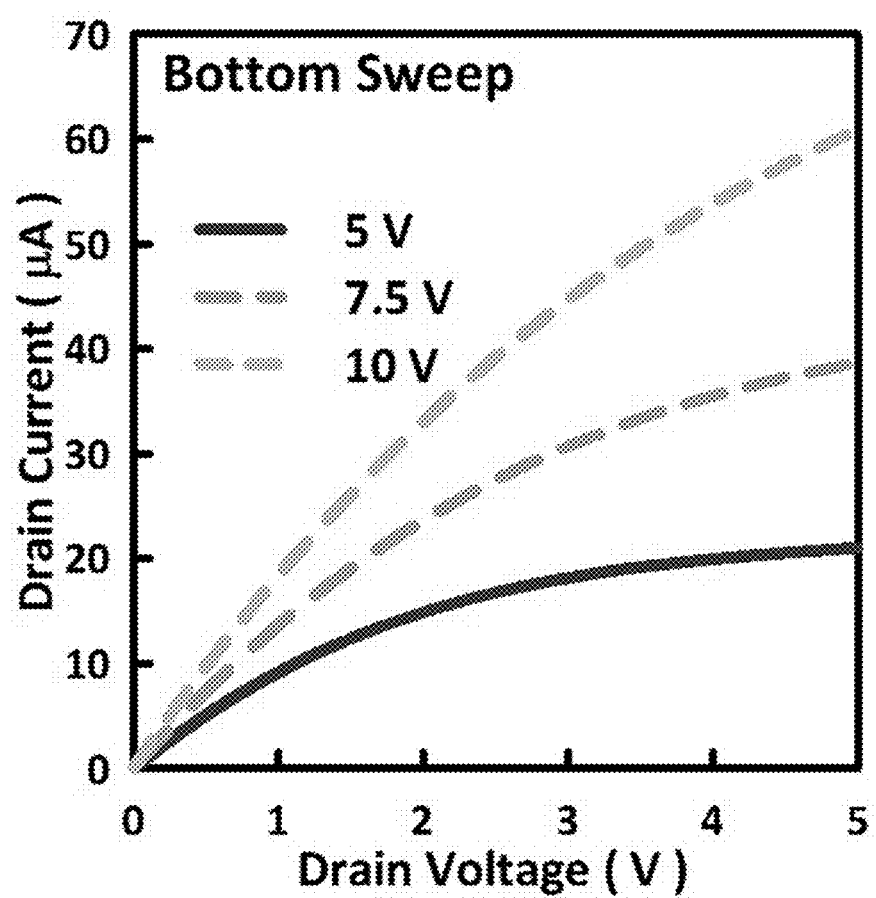
Figure 14F:
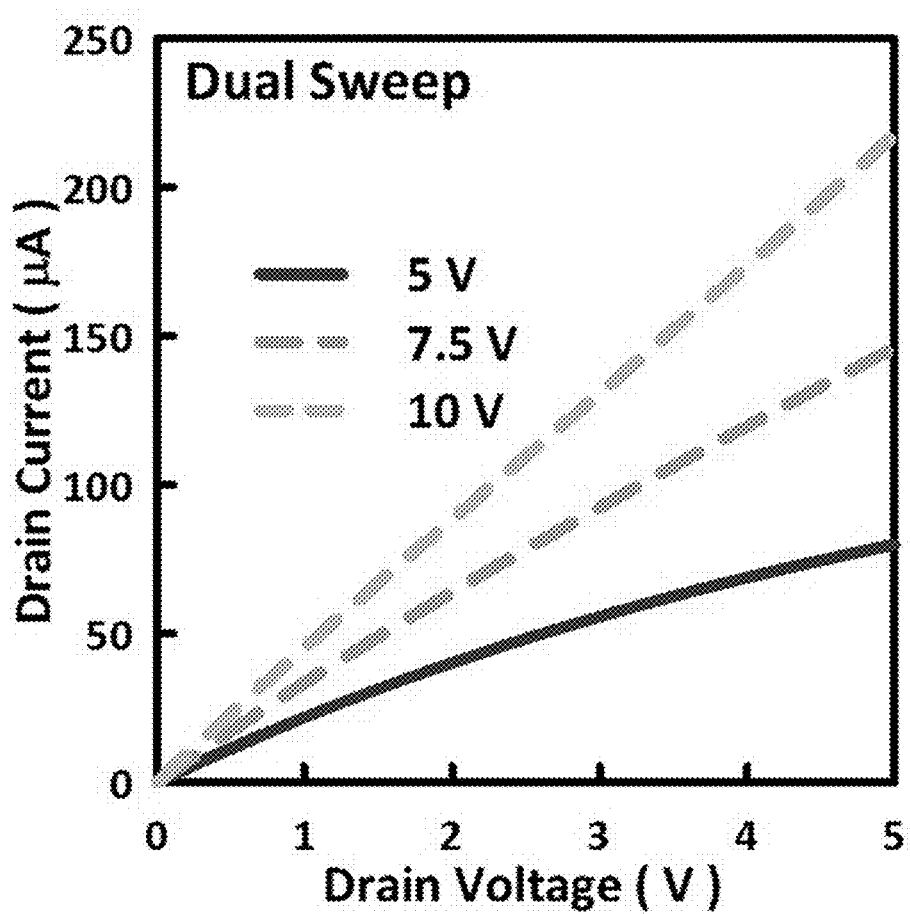

FIG. 14D illustrates drain outputs when a channel length is 2 μm, a second gate electrode is subjected to sweep (top sweep), and a first gate electrode is grounded, FIG. 14E illustrates drain outputs when a channel length is 2 μm, a first gate electrode is subjected to sweep (bottom sweep), and a second gate electrode is grounded, and FIG. 14F illustrates drain outputs when a channel length is 2 μm and first and second gate electrodes are electrically or physically connected and thus are simultaneously subjected to sweep (dual sweep).

Figure 15A:
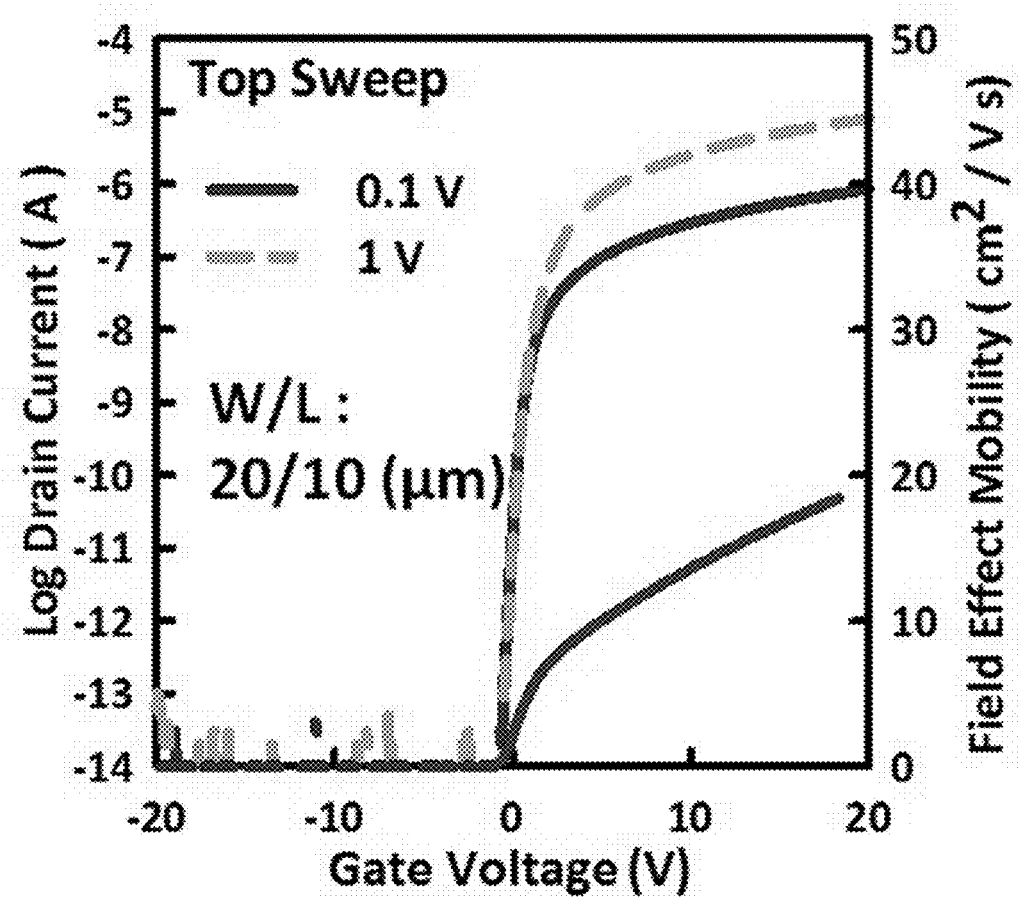
Figure 15B:
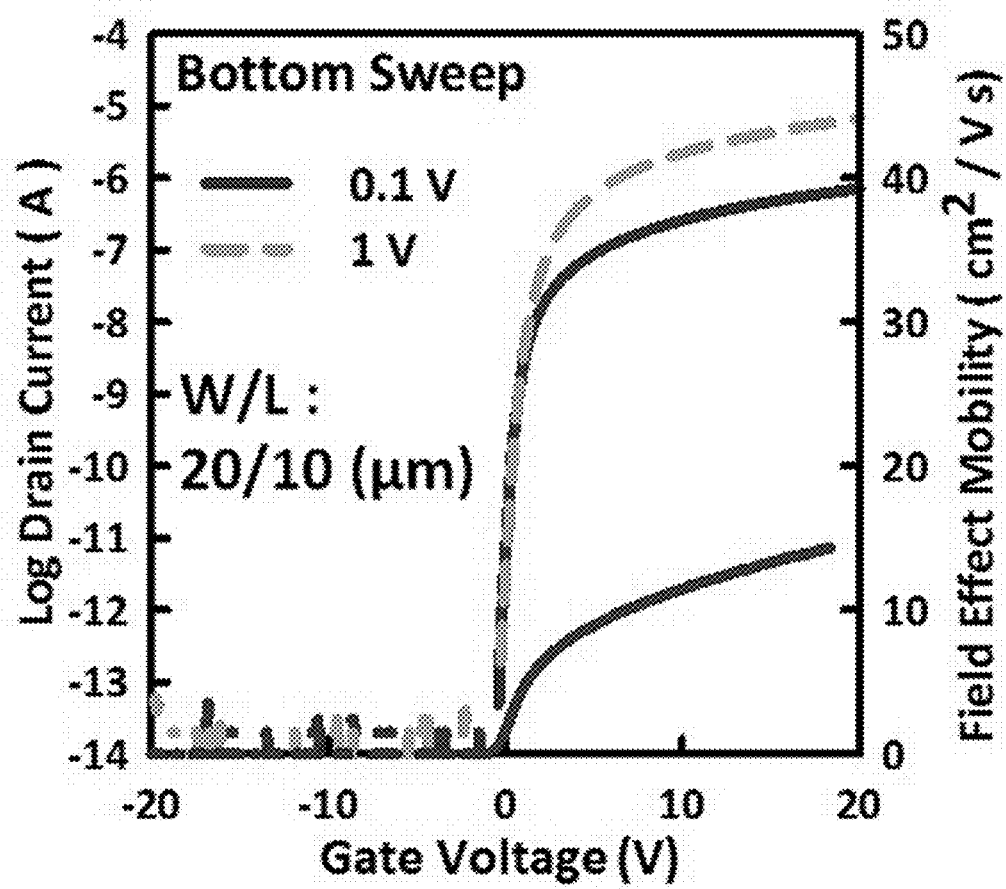
Figure 15C:
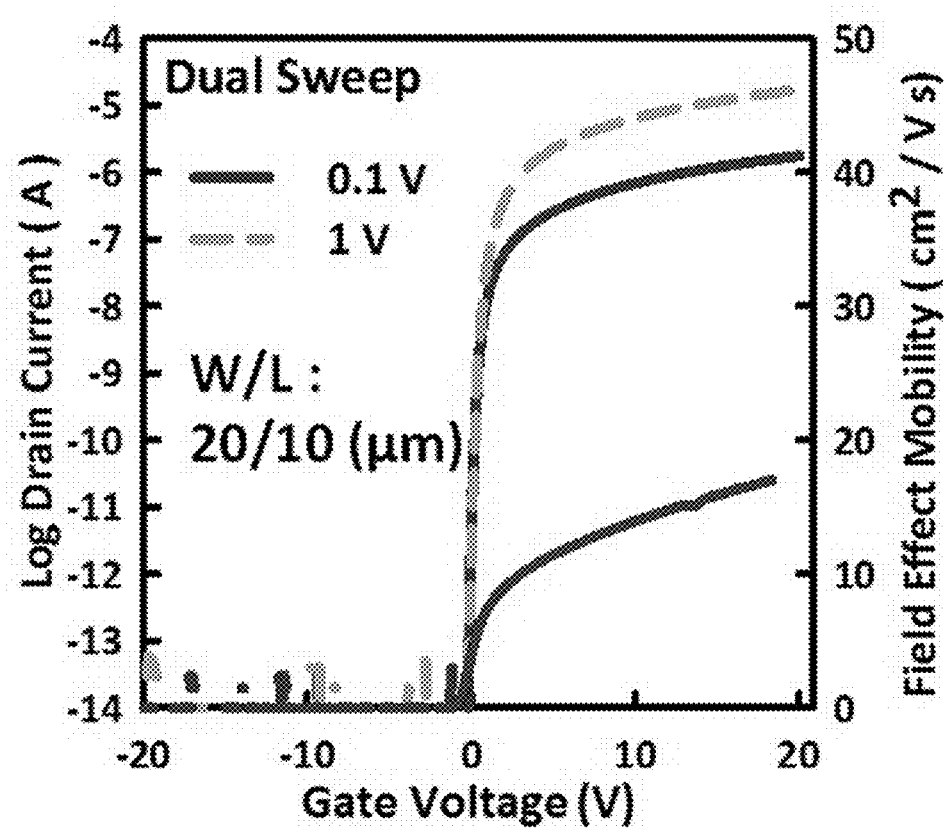

FIG. 15A illustrates the distribution of electrons and a current flow when a channel length is 10 μm, a second gate electrode is subjected to −20 V to 20 V sweep (top sweep), and a first gate electrode is grounded, FIG. 15B illustrates the distribution of electrons and a current flow when a channel length is 10 μm, a first gate electrode is subjected to −20 V to 20 V sweep (bottom sweep), and a second gate electrode is grounded, and FIG. 15C illustrates when a channel length is 10 μm and first and second gate electrodes are electrically or physically connected and thus are simultaneously subjected to −20 V to 20 V sweep (dual sweep).

Figure 15D:
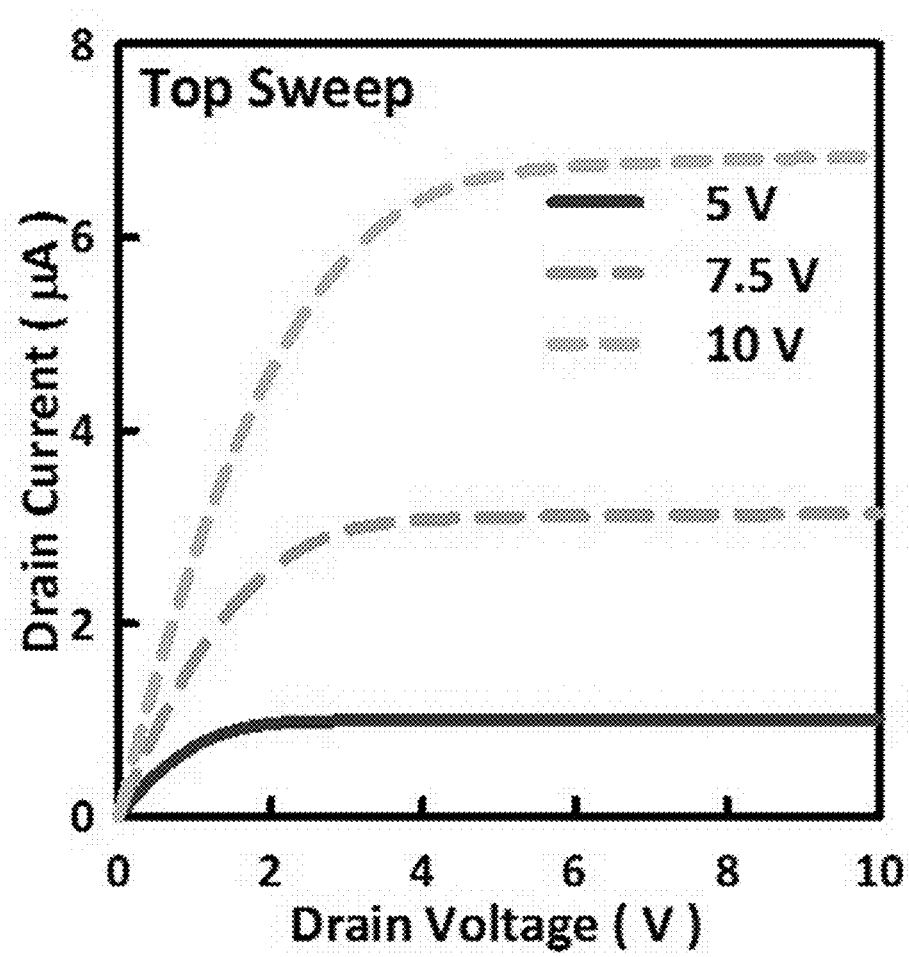
Figure 15E:
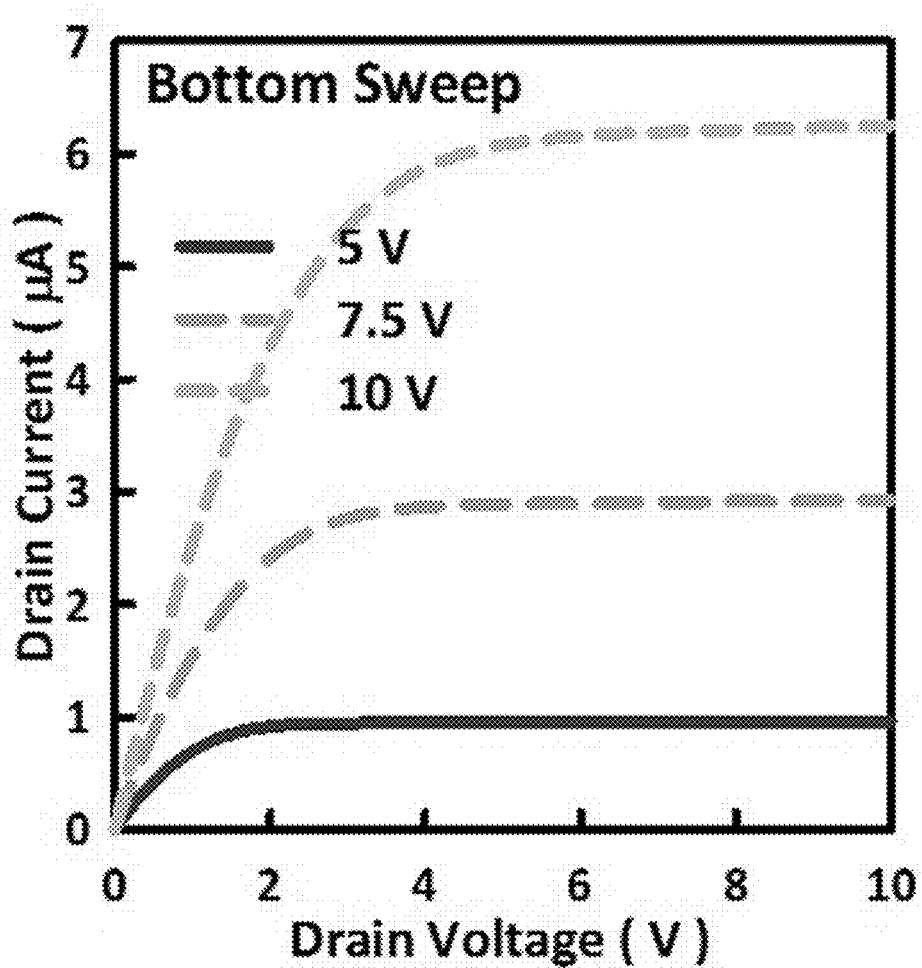
Figure 15F:
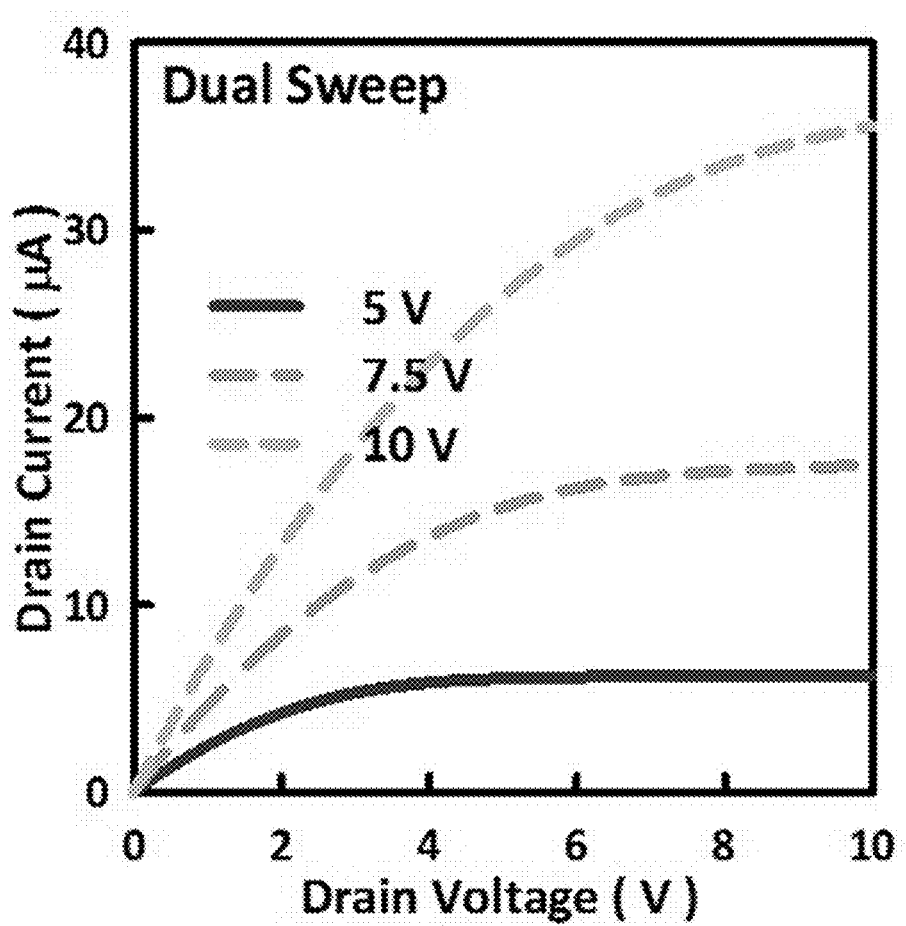

FIG. 15D illustrates drain outputs when a channel length is 10 μm, a second gate electrode is subjected to sweep (top sweep), and a first gate electrode is grounded, FIG. 15E illustrates drain outputs when a channel length is 10 μm, a first gate electrode is subjected to sweep (bottom sweep), and a second gate electrode is grounded, and FIG. 15F illustrates drain outputs when a channel length is 10 μm and first and second gate electrodes are electrically or physically connected and thus are simultaneously subjected to sweep (dual sweep).

Figure 16:
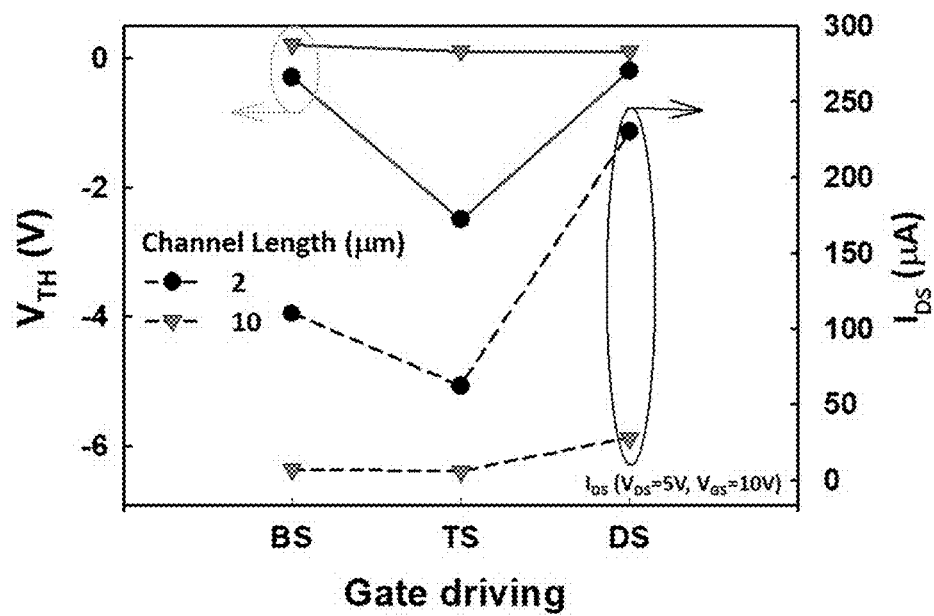
FIG. 16 illustrates electrical characteristics of an oxide semiconductor thin film transistor of according to an embodiment of the present disclosure.

FIG. 16 illustrates electrical characteristics of an oxide semiconductor thin film transistor of according to an embodiment of the present disclosure.

In particular, FIG. 16 illustrates channel length-dependent electrical characteristics of the oxide semiconductor transistor with coplanar structure according to an embodiment of the present disclosure.

Referring to FIG. 16, an abscissa of the graph indicates a gate driving type. Here, the gate driving type includes bottom sweep, top sweep, and dual sweep.

A left ordinate of the graph indicates a threshold voltage, and a right ordinate thereof indicates a drain current. Here, a channel length of 2 μm and a channel length of 10 μm are used as comparative objects.

The present disclosure uses a laminated structure of carbon nanotubes and a metal electrode as source and drain electrodes according, thereby preventing property deterioration due to bending and high heat and providing stable characteristics upon formation of a short channel.

That is, the present disclosure can address problems due to short channel effects of a transistor by using the laminated structure of carbon nanotubes and a metal electrode.

Figure 17A:
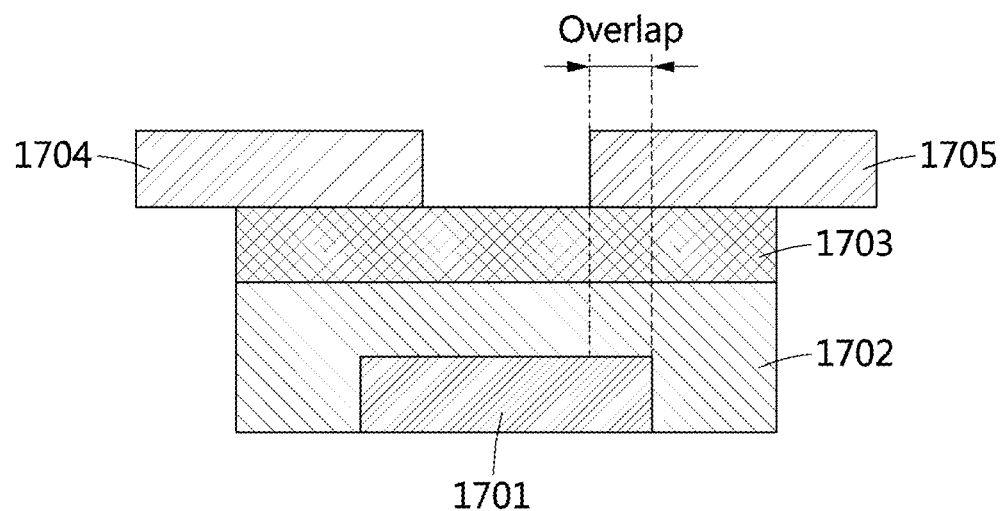
FIGS. 17A and 17B are sectional views illustrating an overlap and offset of oxide semiconductor thin film transistors according to embodiments of the present disclosure.
Figure 17B:
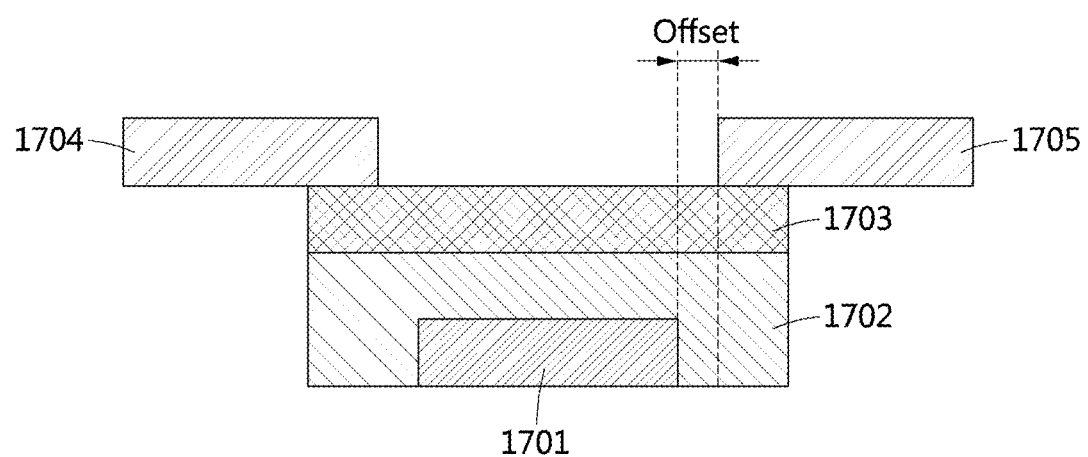

FIGS. 17A and 17B are sectional views illustrating an overlap and offset of oxide semiconductor thin film transistors according to embodiments of the present disclosure.

In particular, FIGS. 17A and 17B illustrate configurations wherein a first gate electrode is spaced apart from source and drain electrodes formed on the oxide semiconductor layer.

FIG. 17a illustrates an overlap between the first gate electrode and the drain electrode.

For example, an offset and an overlap may mean at least one of a width between an end of a first gate electrode 1701 and a source electrode 1704 and a width between another end of the first gate electrode 1701 and a drain electrode 1705.

For example, the overlap may mean an overlapping portion between the first gate electrode 1701 and the drain electrode 1705 when the first gate electrode 1701 and the drain electrode 1705 are viewed in a direction perpendicular to the substrate. Accordingly, the overlap may have a width of 0 μm to 3 μm.

FIG. 17B illustrates an offset between the first gate electrode and the drain electrode.

An offset may mean a distance between the first gate electrode 1701 and the drain electrode 1705 spaced apart from each other in a horizontal direction when the first gate electrode 1701 and the drain electrode 1705 are viewed in a direction perpendicular to the substrate. Accordingly, the offset may have a width of −1 μm to 0 μm.

Accordingly, the offset of the first gate electrode 1701 of the oxide semiconductor thin film transistor according to an embodiment of the present disclosure may reduce a defect region formed at a lower interface of an oxide semiconductor layer 1703, thereby reducing a threshold voltage change under positive bias stress (PBS). Accordingly, electrical characteristics of the oxide semiconductor thin film transistor may be improved.

Although an oxide semiconductor thin film transistor and a method of fabricating the same have been described above, a display apparatus including the oxide semiconductor thin film transistor and a method of manufacturing the display apparatus may also be within the scope of the present disclosure.

In particular, the oxide semiconductor thin film transistors according to the embodiments of the present disclosure may be used as a pixel element of a flexible display such as a liquid crystal display (LCD) or an organic light emitting display (AMOLED).

More particularly, a display apparatus may be manufactured by fabricating an oxide semiconductor thin film transistor according to the method described above, and then forming a pixel electrode electrically connected to any one of source and drain electrodes.

For example, by the method of fabricating a display apparatus according to an embodiment of the present disclosure, a passivation layer may be formed to cover source and drain electrodes, and a pixel electrode connected to a drain electrode through a through hole of the passivation layer may be formed, as shown in FIGS. 1A to 1F.

In addition, by the method of fabricating a display apparatus according to an embodiment of the present disclosure, an intermediate layer (not shown) including a light emitting layer may be formed on the pixel electrode and a counter electrode may be formed on the intermediate layer to manufacture an organic light emitting display apparatus.

Accordingly, the oxide semiconductor thin film transistor having high electrical characteristics of the present disclosure may be used as a pixel element of a flexible display such as a liquid crystal display (LCD) or an organic light emitting display (AMOLED).

As apparent from the above description, the present disclosure provides source and drain electrodes formed using a laminated structure of carbon nanotubes and a metal electrode, thereby securing stable characteristics of an oxide semiconductor with a short channel.

The present disclosure provides an oxide semiconductor thin film transistor fabricated using carbon nanotubes (CNTs) with high thermal conductivity, high work function, and low Young's modulus, and a laminated structure of the carbon nanotubes and a metal electrode as source and drain electrodes, thereby exhibiting stable characteristics in a semiconductor device having a short channel.

The present disclosure provides a source electrode and drain electrode formed using carbon nanotubes as a material with a high thermal conductivity to prevent diffusion of a metal into an oxide semiconductor layer after being subjected to high current stress.

The present disclosure provides source and drain electrodes fabricated using a laminated structure of carbon nanotubes and a metal electrode, thereby preventing property deterioration due to bending and high heat and stable characteristics upon formation of a short channel.

The present disclosure provides source and drain electrodes formed using carbon nanotubes, thereby providing high flexibility.

The present disclosure provides an oxide semiconductor thin film transistor having high electrical characteristics, thereby being used as a pixel element of a flexible display such as a liquid crystal display (LCD), an organic light emitting display (AMOLED), or a micro AMOLED.

The present disclosure provides source and drain electrodes formed using carbon nanotubes and a metal electrode, thereby securing stable characteristics in a short channel by increasing contact resistance.

The embodiments disclosed in the claims and the specification of the present disclosure may be implemented by hardware, software, or a combination of hardware and software.

Such software may be stored in a computer-readable storage medium. The computer-readable storage medium stores at least one program (software module), i.e., at least one program including instructions for the wearable headset device to execute the method of the present disclosure when the wearable headset device is driven by at least one processor.

Such software may be stored in a volatile storage device, or a non-volatile device such as Read Only Memory (ROM); in memory such as random access memory (RAM), a memory chip, a device, or an integrated circuit; or in an optical or magnetic readable medium such as a Compact Disc-ROM (CD-ROM), a Digital Versatile Disc (DVD), a magnetic disk, or a magnetic tape.

The storage devices and storage media are examples of machine-readable storage means suitable for storing a program (s) which include instructions implementing embodiments when executed.

In the aforementioned embodiments, constituents of the present disclosure were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present disclosure have been described, those skilled in the art will appreciate that many modifications and changes can be made to the present disclosure without departing from the spirit and essential characteristics of the present disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

| | |
|---|---|
| 100: oxide semiconductor | 101: substrate |
| 102: first gate electrode | 103: gate insulator |
| 104: oxide semiconductor layer | 105: carbon nanotube |
| 107: source electrode | 108: drain electrode |
| 109: passivation layer | 110: source electrode |
| 111: drain electrode | 112: second gate electrode |

What is claimed is:

1. An oxide semiconductor thin film transistor, comprising:
    a substrate;
    a first gate electrode formed on the substrate;
    a gate insulator formed on the first gate electrode;
    an oxide semiconductor layer formed on the gate insulator;
    source and drain electrodes formed by depositing carbon nanotubes (CNTs) and a metal electrode on the oxide semiconductor layer and patterning the deposited CNTs and metal electrode such that the source electrode and the drain electrode are spaced apart from each other;
    a passivation layer formed to cover the gate insulator, the oxide semiconductor layer, and the source and drain electrodes and having holes to grow the source and drain electrodes;
    a pixel electrode on the passivation layer,
    wherein the pixel electrode is electrically connected to each of the source and drain electrodes, and electrically connects the source and drain electrodes to other components outside the oxide semiconductor thin film transistor,
    wherein the CNTs serve to prevent diffusion of a metal of the metal electrode into the formed oxide semiconductor layer,
    wherein the source and drain electrodes are formed by laminating the metal electrode on the CNTs,
    wherein the source and drain electrodes serve to control contact resistance by using the passivation layer having the holes to grow the source and drain electrodes in a state that molybdenum (Mo) forming the metal electrode electrically contacts the oxide semiconductor layer,
    wherein the source and drain electrodes are in Schottky diode contact, thereby controlling contact resistance,
    wherein the CNTs of the source and drain electrodes are formed to a thickness of 10 nm to 150 nm,
    wherein the CNTs of the source and drain electrodes serve to prevent molybdenum (Mo) forming the metal electrode from being diffused into the oxide semiconductor layer at a temperature of 400° C. or higher,
    wherein the substrate includes at least one thin film transistor region disposed in a thin film transistor region arranged in a matrix form in the substrate,
    wherein the substrate is formed to a thickness of 1 μm to 10 μM,
    wherein the substrate has a flexibility to be bent or folded in a specific direction,
    wherein the substrate is formed of at least one material selected from a group consisting of polyester, polyvinyl, polycarbonate, polyethylene, polyacetate, polyimide, polyethersulfone (PES), polyacrylate (PAR), polyethylene naphthalate (PEN), and polyethylene terephthalate (PET), and
    the passivation layer is formed of a same material as that of the gate insulator,
    wherein the pixel electrode is a second gate electrode formed on the passivation layer, and
    wherein the oxide semiconductor thin film transistor further comprises a connection electrode configured to electrically connect the first gate electrode and the second gate electrode,
    wherein the second gate electrode is formed to be spaced apart from the source and drain electrodes by 1 μm to 3 μm in a horizontal direction, and
    wherein the first gate electrode and the second gate electrode are electrically connected to each other to apply a same voltage thereto.

2. The oxide semiconductor thin film transistor according to claim 1, wherein the first gate electrode is formed to be spaced apart from the source and drain electrodes formed on the oxide semiconductor layer by 1 μm to 3 μm in a horizontal direction.

3. A coplanar oxide semiconductor thin film transistor, comprising:
  an oxide semiconductor layer formed on a substrate;
  a first gate electrode formed the oxide semiconductor layer;
  source and drain electrodes formed by depositing carbon nanotubes (CNTs) and a metal electrode and patterning the deposited CNTs and metal electrode such that the source electrode and the drain electrode are spaced apart from each other;
  a passivation layer;
  a pixel electrode on the passivation layer, the pixel electrode being a second gate electrode formed on the passivation layer; and
  a connection electrode configured to electrically connect the first gate electrode and the second gate electrode,
  wherein the pixel electrode is electrically connected to each of the source and drain electrodes, and electrically connects the source and drain electrodes to other components outside the oxide semiconductor thin film transistor,
  wherein the CNTs serves to prevent diffusion of a metal of the metal electrode into the formed oxide semiconductor layer,
  wherein the source and drain electrodes are formed by laminating the metal electrode on the CNTs,
  wherein the source and drain electrodes serves to control contact resistance by using the passivation layer having holes to grow the source and drain electrodes in a state that molybdenum (Mo) forming the metal electrode electrically contacts the oxide semiconductor layer,
  wherein the source and drain electrodes are in Schottky diode contact, thereby controlling contact resistance,
  wherein the CNTs of the source and drain electrodes are formed to a thickness of 10 nm to 150 nm,
  wherein the CNTs of the source and drain electrodes serve to prevent molybdenum (Mo) forming the metal electrode from being diffused into the oxide semiconductor layer at a temperature of 400° C. or higher,
  wherein the substrate includes at least one thin film transistor region disposed in a thin film transistor region arranged in a matrix form in the substrate,
  wherein the substrate is formed to a thickness of 1 μm to 10 μm,
  wherein the substrate has a flexibility to be bent or folded in a specific direction,
  wherein the substrate is formed of at least one material selected from a group consisting of polyester, polyvinyl, polycarbonate, polyethylene, polyacetate, polyimide, polyethersulfone (PES), polyacrylate (PAR), polyethylene naphthalate (PEN), and polyethylene terephthalate (PET), and
  the passivation layer is formed of a same material as that of the gate insulator,
  wherein the passivation layer is formed to cover the gate insulator, the oxide semiconductor layer, and the source and drain electrodes and have the holes to grow the source and drain electrodes,
  wherein the second gate electrode is formed to be spaced apart from the source and drain electrodes by 1 μm to 3 μm in a horizontal direction, and
  wherein the first gate electrode and the second gate electrode are electrically connected to each other to apply a same voltage thereto.

4. A display apparatus, comprising:
  a substrate;
  the oxide semiconductor thin film transistor according to claim 3 formed on the substrate; and
  a display device electrically connected to the oxide semiconductor thin film transistor.

5. The display apparatus according to claim 4, wherein the display device is an organic light emitting device.

6. A method of fabricating an oxide semiconductor thin film transistor, the method comprising:
  forming a first gate electrode on a substrate;
  forming a gate insulator on the first gate electrode;
  forming an oxide semiconductor layer on the gate insulator;
  depositing CNTs and a metal electrode on the formed oxide semiconductor layer;
  forming source and drain electrodes by patterning the deposited CNTs and metal electrode such that the source and drain electrodes are spaced apart from each other; and
  forming a passivation layer to cover the gate insulator, the oxide semiconductor layer, and the source and drain electrodes and having holes to grow the source and drain electrodes on the formed source and drain electrodes;
  forming a pixel electrode on the passivation layer, the pixel electrode being a second gate electrode on the passivation layer; and
  forming a connection electrode electrically connecting the first gate electrode and the second gate electrode,
  wherein the pixel electrode is electrically connected to each of the source and drain electrodes, and electrically connects the source and drain electrodes to other components outside the oxide semiconductor thin film transistor,
  wherein the CNTs serve to prevent diffusion of a metal of the metal electrode into the formed oxide semiconductor layer,
  wherein the source and drain electrodes are formed by laminating the metal electrode on the CNTs,
  wherein the source and drain electrodes serve to control contact resistance by using the passivation layer having the holes to grow the source and drain electrodes in a state that molybdenum (Mo) forming the metal electrode electrically contacts the oxide semiconductor layer,
  wherein the source and drain electrodes are in Schottky diode contact, thereby controlling the contact resistance,
  wherein the CNTs of the source and drain electrodes are formed to a thickness of 10 nm to 150 nm, and
  wherein the CNTs serve to prevent diffusion of the molybdenum (Mo) into the oxide semiconductor layer at a high temperature of 400° C. or higher,
  wherein the substrate includes at least one thin film transistor region disposed in a thin film transistor region arranged in a matrix form in the substrate,
  wherein the substrate is formed to a thickness of 1 μm to 10 μm,
  wherein the substrate has a flexibility to be bent or folded in a specific direction,
  wherein the substrate is formed of at least one material selected from a group consisting of polyester, polyvinyl, polycarbonate, polyethylene, polyacetate, polyimide, polyethersulfone (PES), polyacrylate (PAR), polyethylene naphthalate (PEN), and polyethylene terephthalate (PET), and
  the passivation layer is formed of a same material as that of the gate insulator, wherein the second gate electrode is formed to be spaced apart from the source and drain electrodes by 1 μm to 3 μm in a horizontal direction, and wherein the first gate electrode and the second gate electrode are electrically connected to each other to apply same voltage thereto.

* * * * *